US006351351B1

United States Patent
Takasugi

(10) Patent No.: US 6,351,351 B1
(45) Date of Patent: Feb. 26, 2002

(54) MAGNETIC HEAD SUSPENSION

(75) Inventor: Satoru Takasugi, Kyoto (JP)

(73) Assignee: Suncall Corporation, Kyoto-fu (JP)

( * ) Notice: Subject to any disclaimer, the term of this patent is extended or adjusted under 35 U.S.C. 154(b) by 0 days.

(21) Appl. No.: 09/396,896

(22) Filed: Sep. 15, 1999

(30) Foreign Application Priority Data

Dec. 10, 1998 (JP) ............................................. 10-351326
Sep. 3, 1999 (JP) ............................................. 11-249976

(51) Int. Cl.$^7$ ................................................. G11B 5/60
(52) U.S. Cl. ..................................................... 360/245.9
(58) Field of Search ........................... 360/245.9, 245.8, 360/244.3

(56) References Cited

U.S. PATENT DOCUMENTS 5,608,591 A * 3/1997 Klaassen ................. 360/245.9
5,737,152 A * 4/1998 Balakrishnan ........... 360/245.9

* cited by examiner

*Primary Examiner*—A. J. Heinz
*Assistant Examiner*—Angel Castro
(74) *Attorney, Agent, or Firm*—Jordan and Hamburg LLP

(57) ABSTRACT

The present invention provides an improved magnetic head suspension including a flexure with a flexure wiring structure therein, a load beam constituting a suspension in cooperation with the flexure, and a relay FPC with a flexure wiring structure therein for connection between the flexure and an external wiring structure. A flexure signal line portion has a characteristic impedance matching with that of an FPC signal line portion. A connection portion of the flexure wiring structure has a width substantially equal to that of the FPC signal line portion, and has a length determined by multiplying a positional error in joining between the flexure and the FPC by two and adding the result to the width of the connection portion of the FPC wiring structure. The connection portion of the FPC wiring structure has a width substantially equal to that of the flexure wiring structure, and has a length determined by multiplying the positional error by two and adding the result to the width of the connection portion of the flexure wiring structure. The connection portion of the flexure wiring structure crosses the connection portion of the FPC wiring structure at right angle and is connected thereto.

9 Claims, 19 Drawing Sheets

FIG. 9
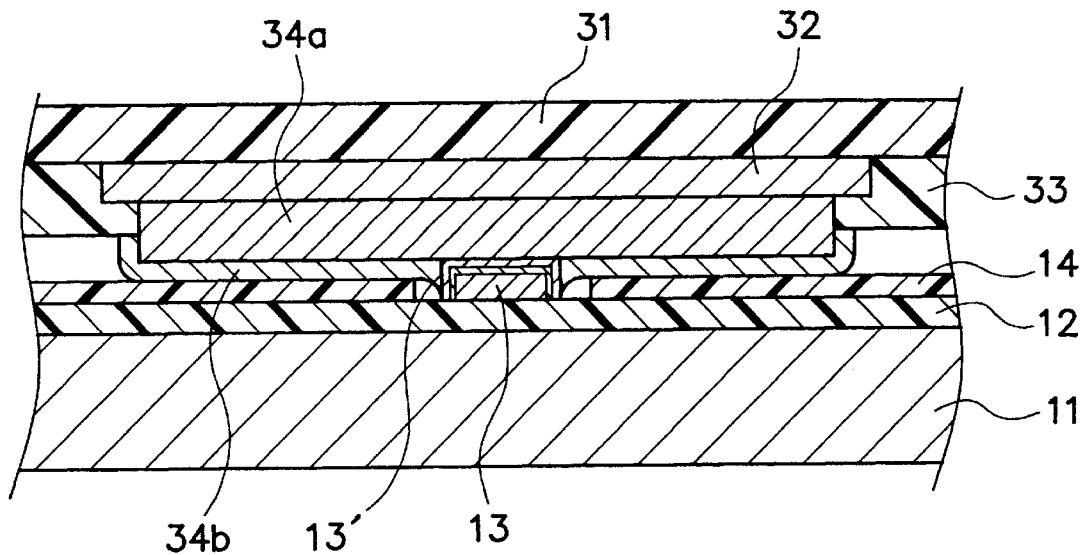
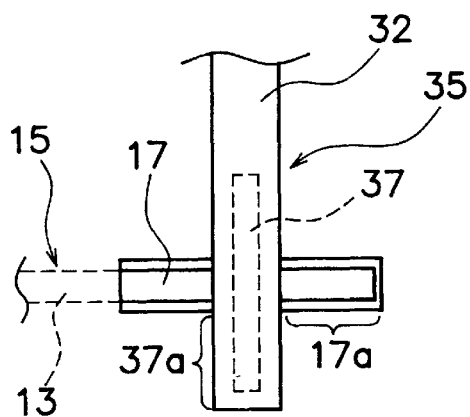
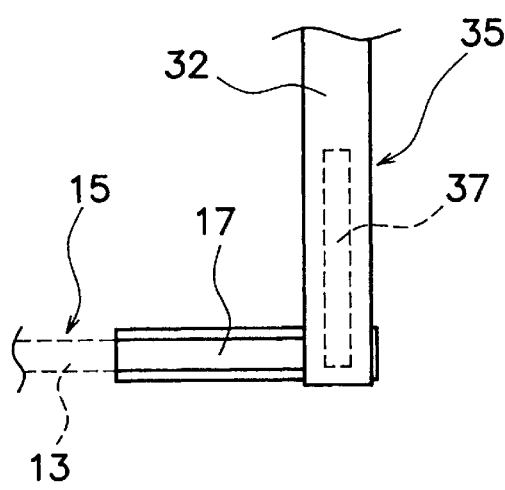
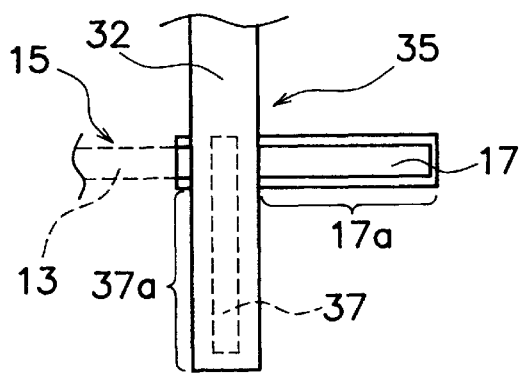
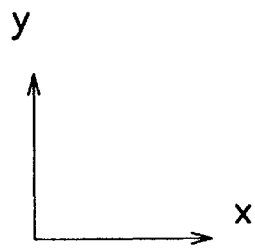

MAGNETIC HEAD SUSPENSION

BACKGROUND OF THE INVENTION

1. Field of the Invention

The present invention relates to a suspension for supporting a magnetic head slider for use in a rigid magnetic recording disk drive (Hard Disk Drive: hereinafter abbreviated to as HDD).

2. Discussion of the Background

A wiring integrated suspension of the type that is integrally equipped with a part of a wiring structure connected to a magnetic head has recently come into use. The wiring structure is used for connection between the magnetic head and an integrated circuit (hereinafter abbreviated to as preamplifier IC) including a driver circuit for a write signal and a preamplifier circuit for a read signal. Where a magnetoresistive (MR) device is used for the magnetic head, it functions to read a signal, while an inductive device is used to write a signal. Accordingly, four or five wires (two or three wires for reading and two wires for writing) are required in this wiring structure.

FIG. 18 illustrates the wiring integrated suspension installed in the HDD, where the wiring integrated suspension 100 includes a wiring integrated flexure 110 with a magnetic head slider 200 mounted thereon, a load beam 120 for supporting the said flexure 110 and generating a force to press the magnetic head slider 200 against a magnetic disk 300, and a base plate for securing the said load beam 120 to an arm 130 by caulking. In FIG. 18, the base plate is positioned under the arm 130 and therefore cannot be seen. The arm 130 can pivotally be moved around a pivot 140 on a plane in parallel with the magnetic disk 300, so that the magnetic head slider 200 can be moved to a selected track position on the magnetic disk 300. A voice coil motor (VCM) 150 is coupled to a proximal end portion of the said arm 130 so as to drive the arm 130. A terminal (not illustrated) closer to a proximal end of the wiring structure integral with the suspension 100 is connected to a relay FPC (Flexible Printed Circuit) 160 closer to its distal end. The relay FPC 160 is, in turn, connected at its proximal end portion 162 to a print wiring board 170 such as an FPC, on which a preamplifier IC 171 is mounted. FIG. 19 illustrates a wiring integrated suspension of the type that includes a flexure, a load beam and a base plate. In addition to this type of the wiring integrated suspension, there exists a wiring integrated suspension of the type that omits the base plate by directly welding a load beam to an arm.

Such wiring integrated suspensions have been proposed, for example, in Japanese Laid-Open (Kokai) Patent Publication Nos. 8-106617, 8-111015 (U.S. Pat. No. 5,657,186), 9-128728, U.S. Pat. No. 5,680,274, U.S. Pat. No. 5,717,547, etc.

FIGS. 19 and 20 respectively illustrate a perspective view of a wiring integrated suspension 100 of a conventional type, and an exploded perspective view of the wiring integrated suspension of FIG. 19. In these figures, the upper side of the suspension faces the disk. As illustrated in FIGS. 19 and 20, the wiring integrated suspension 100 includes the wiring integrated flexure 110, the load beam 120 and the base plate 180, all of which are welded together at welds 99.

The load beam 120 is provided with a load-bent portion 121, thereby generating the force to press the slider against the magnetic disk.

The flexure 110 includes a wiring structure 111 (hereinafter referred to as flexure wiring structure) integrally formed thereon. The said flexure wiring structure 111 is provided at its proximal and distal ends with terminal pads 111a and 111b, each having a width being wider than a signal line portion 111c extending between the said ends. The terminal pad 111b closer to the FPC is used for connection to a wiring structure (hereinafter referred to as FPC wiring structure) of the relay FPC 160, while the terminal pad 111a closer to the slider is used for connection to a terminal of the magnetic head. The terminal pad 111b closer to the FPC is positioned in parallel with the side of the arm 130 via a terminal bending portion 112 located closer to the proximal end of the flexure 110. A magnetic-head-slider mounting region 113 is provided closer to the distal end of the flexure 110 so as to mount the magnetic head slider thereon. The flexure wiring structure 111 is usually connected to the relay FPC 160 with solder bumps, while the flexure wiring structure 111 is connected to a magnetic head terminal by Au ball bonding.

FIGS. 21(a) and 21(b) respectively illustrate vertical cross sections of the signal line portion 111c of the flexure wiring structure, and of the terminal pads 111a and 111b. As best illustrated in these figures, the wiring integrated suspension 110 includes a stainless-steel substrate 115, a polyimide insulating layer 116 laminated on the disk-facing side of the said stainless-steel substrate 115, a conductor layer 117 laminated on the disk-facing side of the said polyimide insulating layer and a polyimide protection layer 118 surrounding the said conductor layer 117. At each of the terminal pads, the polyimide protection layer 118 is provided with an opening 118a, through which the conductor layer 117 is exposed to the outside.

As illustrated in FIGS. 18 to 21, the wiring integrated suspension of the conventional type includes the flexure wiring structure 111 that is connected to the FPC wiring structure via the terminal pad 111b closer to the FPC and the terminal pad 111b of the relay FPC. In consideration of an assembling error, the terminal pad 111b is usually of a rectangular shape with each side of approximately 0.4 to 0.5 mm.

The capacity of the terminal pads will be discussed hereinbelow. The wiring structure in the wiring integrated suspension employs pairs of wires, each pair including two wires. Accordingly, the capacity of the terminal pads does not represent a capacity Cps between one terminal pad and the stainless-steel substrate, but a capacity Cpad between two terminal pads corresponding to each pair of wires. The capacity directly existing between the two pads is much smaller than the capacity existing between the two pads via the stainless-steel substrate, so that the Cpad can be considered as being Cpad≈Cps/2. Where the terminal pads each are of the rectangular shape with each side of 0.4 to 0.5 mm as described above, providing the polyimide insulating layer 116 having a thickness of approximately 10 micrometers in this arrangement results only in the terminal pad capacity of approximately 0.4 to 0.6 pF.

Such a capacity in a joining region of the flexure wiring structure and the FPC wiring structure invites the following disadvantage. Specifically, the above terminal pad capacity results in mismatching of the impedance at the terminal pads, even if the characteristic impedance of the flexure wiring structure has been matched with that of the FPC wiring structure. This mismatching of the impedance in the wiring structure between the magnetic head and the preamplifier IC invites signal reflection in a mismatching portion, resulting in increase in rate of error occurrence in reading data from and writing data to the magnetic disk by the head. The data transferring speed has recently become higher than ever, so that the signal reflection in the wiring structure poses a serious problem in data transfer at such a high speed (see K. B. Klaassen et al, "High Speed Magnetic Recording", IEEE TRANSACTIONS ON MAGNETICS Vol. 34, No. 4, pp. 1822–1827, 1998).

Specifically, a high-speed data transfer causes a large number of high frequency elements in signals. The mismatching of the impedance at the terminal pads results from the above-described capacity Cpad. The impedance 1/wCpad resulting from the said terminal pad capacity is decreased as the frequency is increased, in which w is an angular frequency $2\pi f$.

When Zc<<1/wCpad, in which Zc represents the characteristic impedance of the wiring structure, the mismatching of the impedance at the terminal pads can be disregarded. However, when 1/wCpad is closer to or less than Zc, the mismatching of the impedance at the terminal pads poses a problem.

Among commercially available HDDs at the present day, the highest internal data transfer speed is approximately 200 Mbps. This speed is expected to reach more than 300 to 400 Mbps in the near future, when considering the recent efforts to improve track recording density for data and increase the number of revolutions of the disk. Particularly, shortening the pulse rising/falling time in a writing signal is required, so that the said writing signal contains even frequency elements several times as much as the basic frequency elements. Therefore, when an internal data transfer speed is approximately 300 to 400 Mbps, frequency elements of approximately 1.0 GHz is necessarily taken into consideration. When the signal frequency is 1.0 GHz, the impedance 1/wCpad resulting from the terminal pad capacity becomes 265 to 400 Ω. Since the characteristic impedance Zc of the wiring structure of the suspension is generally 50 to 150Ω, 1/wCpad increases to such a degree as not to be disregarded for Zc.

The present invention has been conceived in consideration of the above problem. It is an object of the present invention to provide a wiring integrated magnetic head suspension that is capable of preventing the mismatching of the impedance in the joining region between the flexure wiring structure and the FPC wiring structure.

SUMMARY OF THE INVENTION

In accordance with the present invention, there is provided a magnetic head suspension including a distal end portion on which a magnetic head slider can be mounted and a proximal end portion adapted for being supported by an arm, which includes:

a flexure including a plate shaped substrate forming at a distal end portion thereof a gimbal portion with a magnetic-head-slider-mounting region, an insulating layer laminated on a magnetic-disk-facing side of said substrate, a conductor layer laminated on said insulating layer for constituting a flexure wiring structure, and an insulative protection layer covering the conductor layer;

a plate shaped load beam including a proximal end portion for being supported by the arm for constituting a suspension in cooperation with the flexure;

an FPC for connection between the conductor layer of the flexure and an external wiring structure;

said FPC including an insulative base layer located on a magnetic-diskfacing side thereof, a conductor layer laminated on a magnetic-disk-facing surface of the insulative base layer, said conductor layer constituting an FPC wiring structure, and an insulative protection layer covering said conductor layer;

the flexure wiring structure including a terminal pad for connection to the magnetic head slider located closer to a distal end of the flexure, a connection portion for connection to the FPC wiring structure located closer to a proximal end of the flexure and a flexure signal line portion for connection between the terminal pad and the connection portion, the connection portion of the flexure wiring structure having a width substantially equal to that of the flexure signal line portion;

the FPC wiring structure including a connection portion for connection to the flexure wiring structure located closer to a distal end of the FPC wiring structure, a terminal pad for connection to an external wiring structure located closer to a proximal end of the FPC wiring structure and an FPC signal line portion for connection between the connection portion and the terminal pad, said FPC signal line portion having a characteristic impedance matching with that of the flexure signal line portion, the connection portion of the FPC wiring structure having a width substantially equal to that of the FPC signal line portion;

the connection portion of the flexure wiring structure having a length determined by multiplying a positional error in joining between the flexure and the FPC by two and adding the result to the width of the connection portion of the FPC wiring structure;

the connection portion of the FPC wiring structure having a length determined by multiplying the positional error by two and adding the result to the width of the connection portion of the flexure wiring structure; and the connection portion of the flexure wiring structure crossing the connection portion of the FPC wiring structure at right angle and connected thereto.

With the above arrangement, the capacity in a connection portion between the flexure wiring structure and the FPC wiring structure is reduced, so that the signal reflection caused in this portion can be reduced.

The substrate of the flexure may integrally be formed with the load beam.

The connection portion of the flexure wiring structure may be located within a distal end region of the load beam. Therefore, the flexure can be reduced in dimension, thereby reducing the manufacturing cost of the flexure.

The connection portion of the flexure wiring structure may be located within a proximal end region of the load beam. Therefore, it is possible to prevent a load over a load-bent portion of the load beam during a process for joining the flexure and the relay FPC together.

The substrate of the flexure preferably includes a connection stage distally extending from the gimbal portion to connect the connection portion of the flexure wiring structure to the connection portion of the FPC wiring structure within the connection stage. This arrangement omits the necessity to form the flexure wiring structure on the gimbal portion so as to provide improved flexibility in designing the magnetic head suspension. It is also possible to omit the likelihood of damaging the flexure wiring structure even if the gimbal portion is subjected to offset-bending. In addition, the flexure wiring structure can be shortened in length, so that flexures can be manufactured with high yields.

The FPC preferably includes on the protection layer thereof a ground conductor layer which is fixed to a ground electric potential and electrically insulated from the conductor layer of the FPC. With this arrangement, the characteristic impedance of the signal line portion in the FPC wiring structure can remain uniform throughout the lengthwise direction of the said signal line portion, so that the signal reflection in the said signal line portion can effectively be prevented.

The FPC preferably includes the protection layer defining an opening closer to the distal end thereof to expose a surface of the conductor layer of the FPC via the opening, and a solder plated layer covering the surface of the conductor layer exposed via the opening to constitute the connection portion of the FPC wiring structure.

The flexure preferably includes the protection layer defining an opening closer to the proximal end thereof to expose a surface of the conductor layer of the flexure via the opening, and a solder plated layer covering the surface of the conductor layer exposed via said opening to constitute the connection portion of the flexure wiring structure.

The flexure and the FPC preferably include dummy pads respectively formed on portions thereof overlapping to each other, said dummy pads being electrically insulated from the conductor layers of the flexure and the FPC for being connected together by soldering when joining the flexure and the FPC together. The said dummy pads can further strengthen the joining strength between the flexure and the relay FPC, thereby providing improved connection reliability between the flexure wiring structure and the FPC wiring structure.

BRIEF DESCRIPTION OF THE DRAWINGS

The above, and other objects, features and advantages of the present invention will become apparent from the detailed description thereof in conjunction with the accompanying drawings wherein:

FIG. 9 is a cross section taken along the line E—E in FIG. 8.

FIG. 10(a) illustrates a joining state between connection portions of the flexure wiring structure and the FPC wiring structure in the case that no positional errors exist between the flexure and the relay FPC.

FIG. 10(b) illustrates a joining state between the connection portions of the flexure wiring structure and the FPC wiring structure in the case that the relay FPC is joined to the flexure with positional errors of 0.12 mm in the forward direction of x-axis and 0.12 mm in the forward direction of y-axis.

FIG. 10(c) illustrates a joining state between the connection portions of the flexure wiring structure and the FPC wiring structure in the case that the relay FPC is joined to the flexure with positional errors of 0.12 mm in the reverse direction of x-axis and 0.12 mm in the reverse direction of y-axis.

DETAILED DESCRIPTION OF THE PREFERRED EMBODIMENT

Embodiment 1

Figure 1:
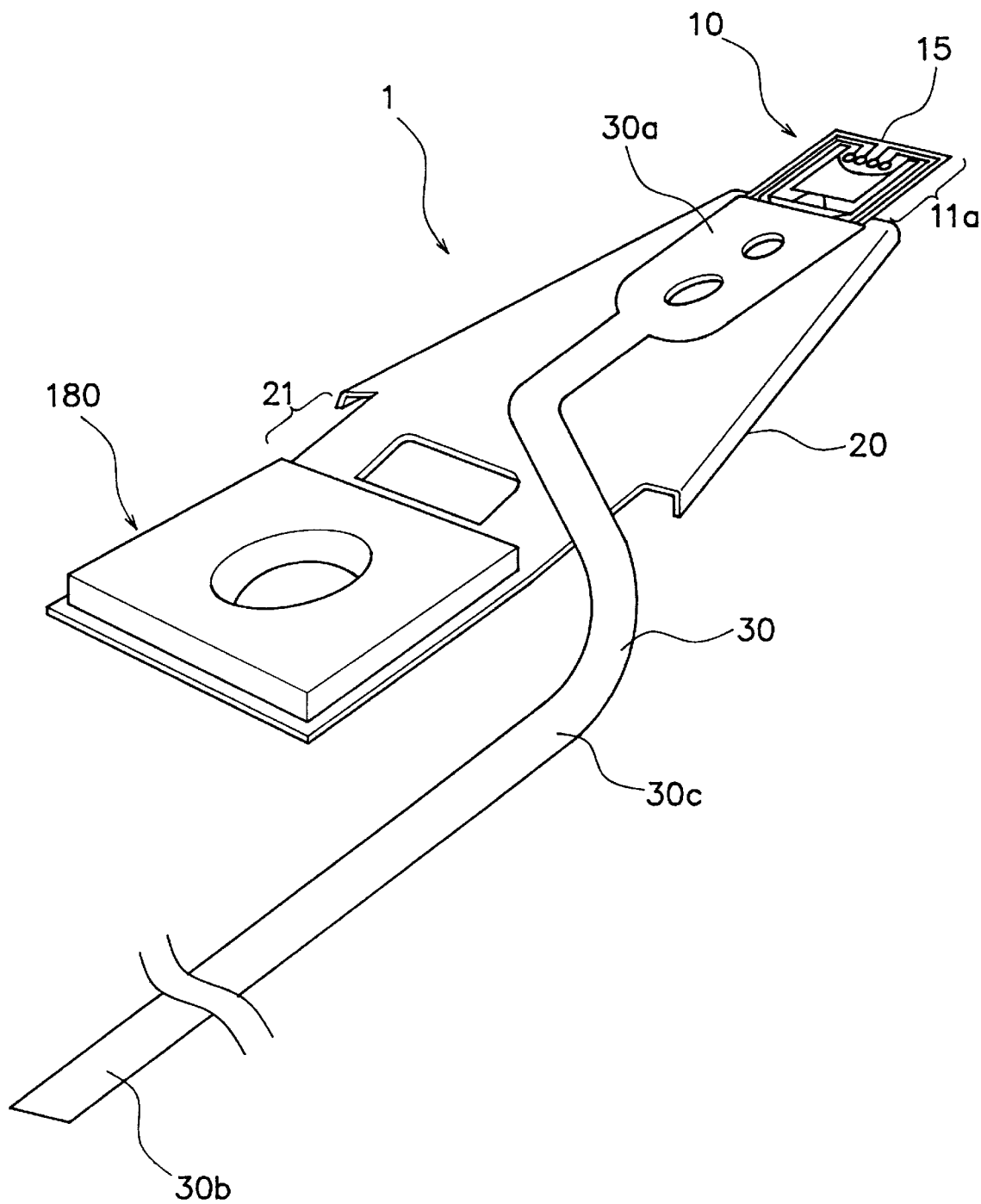
FIG. 1 is a perspective view of a wiring integrated suspension according to a first embodiment of the present invention.

A first embodiment of a wiring integrated suspension 1 according to the present invention will be hereinafter described with reference to the accompanying drawings. FIG. 1 is a perspective view of the wiring integrated suspension 1 as viewed from a disk-facing side thereof. In the drawings hereinafter referred, unless a specific explanation is given, the upper side of the wiring integrated suspension or each part thereof represents a side that faces a magnetic disk surface (hereinafter referred to as front side), and the lower side thereof represents a side that faces in the direction opposite to the magnetic disk surface (hereinafter referred to as rear side).

As illustrated in FIG. 1, the wiring integrated suspension 1 includes a wiring integrated flexure 10 that, in turn, includes a gimbal portion lha adapted for supporting a magnetic head slider (not illustrated) thereon and a flexure wiring structure 15 integrally formed on the flexure 10 with a distal end portion of the flexure wiring structure adapted for being connected to the said magnetic head slider, a load beam 20 supporting the flexure 10, and a relay FPC 30 that, in turn, includes an FPC wiring structure with a distal end portion connected to a proximal end portion of the wiring structure 15 and a proximal end portion adapted for being connected to a printed wiring board with a preamplifier IC mounted thereon. In FIG. 1, a base plate 180 is used to secure the load beam 20 to an arm (not illustrated) by calking, and therefore can be omitted in the arrangement that the load beam 20 is directly joined to the arm by welding or the like. The base plate 180 is preferably formed by pressing a stainless-steel plate of SUS305 or the like having a thickness of 0.2 to 0.3 mm.

Figure 2:
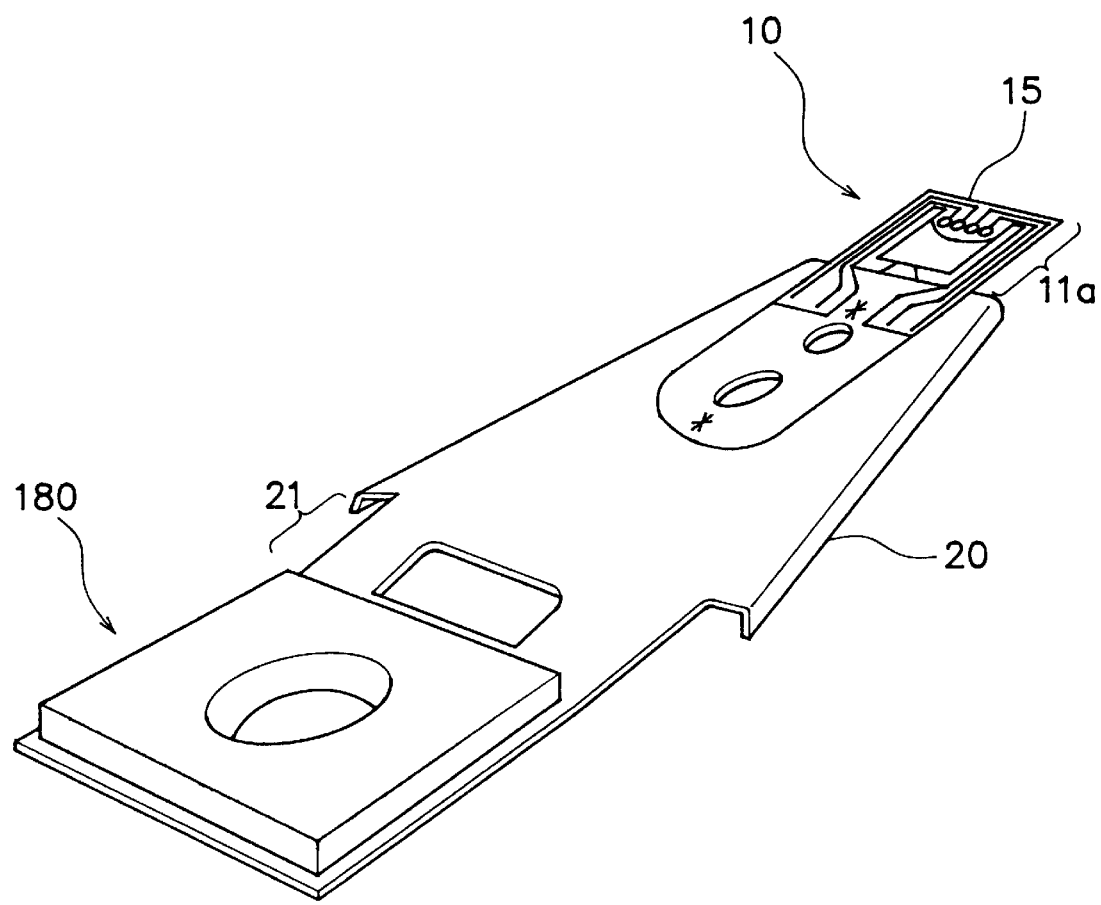
FIG. 2 is a perspective view of the wiring integrated suspension of FIG. 1 with a relay FPC removed therefrom.
Figure 3:
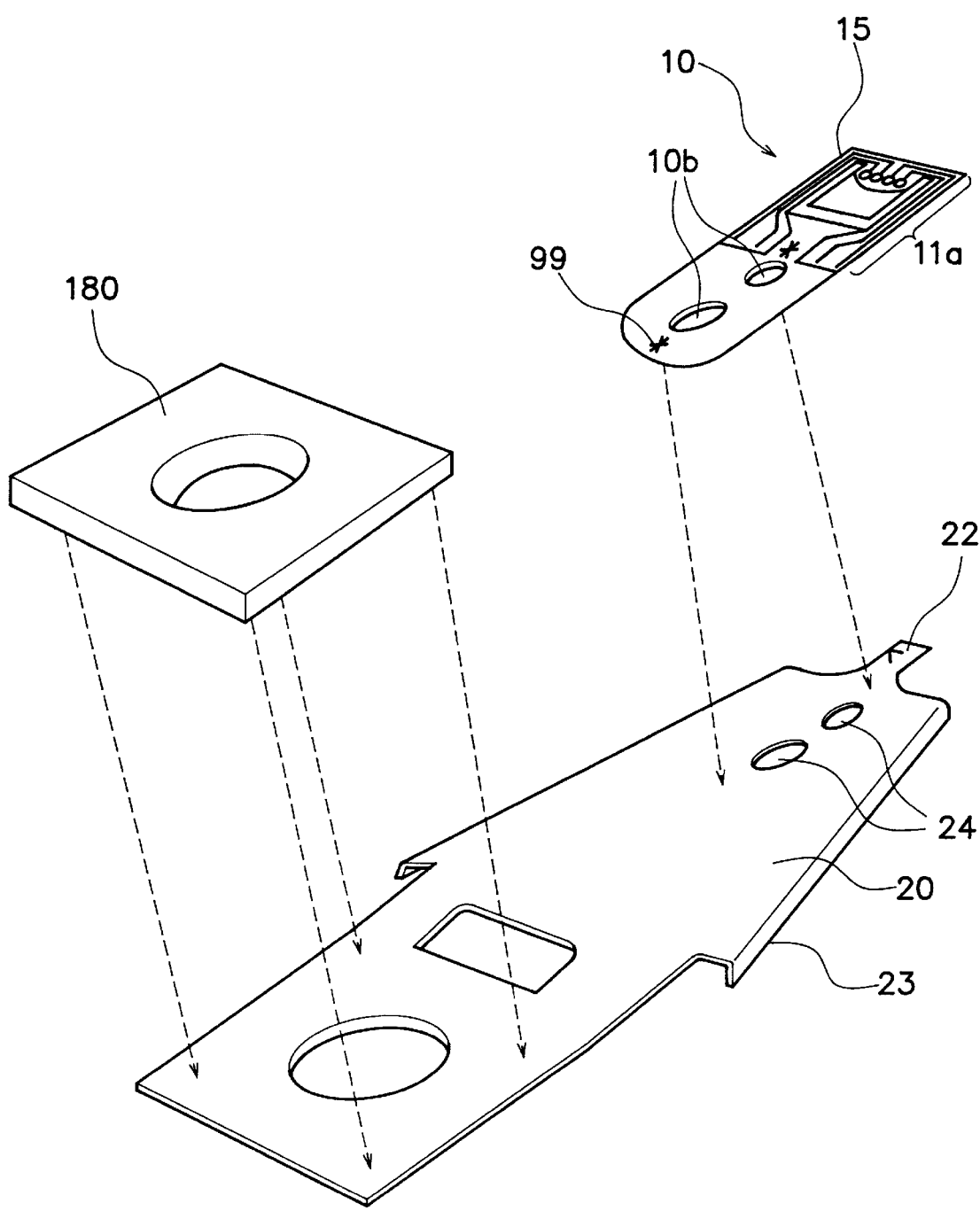
FIG. 3 is an exploded perspective view of a flexure, a load beam and a base plate in the wiring integrated suspension of FIG. 1.

FIG. 2 is a perspective view illustrating the wiring integrated suspension 1 with the relay FPC 30 removed therefrom. FIG. 3 is an exploded perspective view of the flexure 10, the load beam 20 and the base plate 180. As illustrated in FIGS. 2 and 3, the flexure 10 is mounted only on a distal end region of the load beam 20.

As illustrated in FIGS. 1 to 3, the load beam 20 is of a flat shape, connected at its distal end region to the flexure 10 so as to be aligned along the lengthwise direction, and connected at its proximal end portion to the arm (not illustrated). The said load beam 20 defines a load-bent portion 21 extending in the lengthwise direction between the proximal end and the distal end so as to generate an urging force that urges the distal end portion of the load beam 20 to the magnetic disk. The said load-bent portion 21 presses the magnetic head slider mounted on the flexure 10 against the magnetic disk. The said load beam 20 also defines a dimple 22 on the distal end portion thereof and a rail bent portion 23 between the distal end and the load-bent portion 21 thereof. The dimple 22 contacts the rear side of the gimbal portion 11a of the flexure on which the magnetic head slider is mounted, and is located at a portion corresponding to the center of the magnetic head slider, thereby permitting the magnetic head slider to pitch and roll around the dimple 22 following the disk surface.

The load beam 20 is preferably formed by forming its outer configuration by etching a stainless-steel plate of SUS304 or the like having a thickness of 50 to 100 micrometers, and then defining the dimple 22 and the rail bent portion 23 by pressing. The load-bent portion 21 of the load beam may be formed by using rolls after joining the flexure 10 and the base plate 180 together.

The joining between the flexure 10 and the load beam 20 and between the load beam 20 and the base plate 180 is accomplished by a suitable method such as welding. In this embodiment, the connections are accomplished by spot welding at welds 99. Positioning the flexure 10 with respect to the load beam 20 is accomplished by using positioning holes 10b and 24 respectively defined in both parts 10 and 20, as best illustrated in FIG. 3. Specifically, the positioning is accomplished by inserting pins into the said positioning holes.

Figure 4:
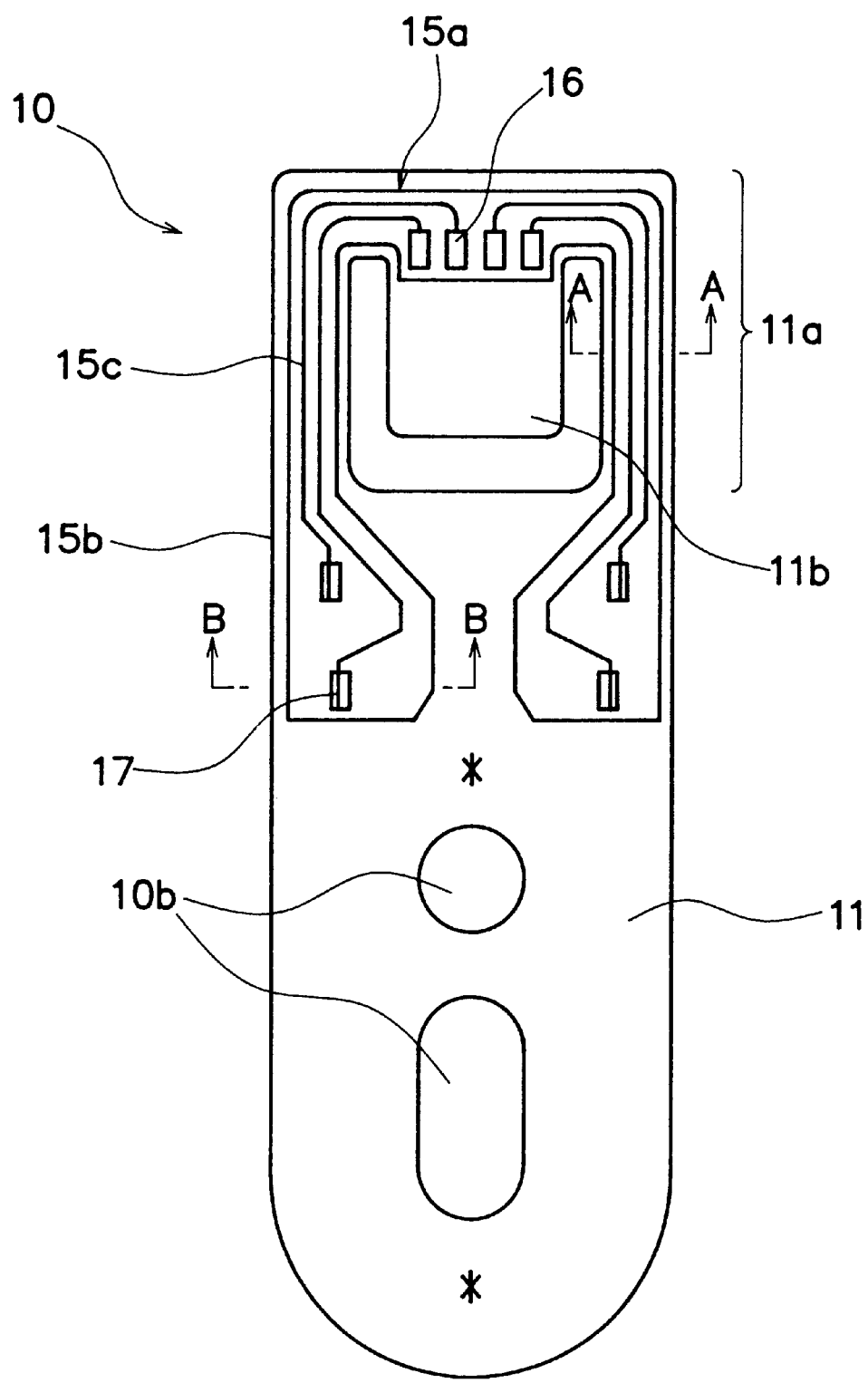
FIG. 4 is a front view illustrating a front side of the flexure in the wiring integrated suspension of FIG. 1.
Figure 5A:
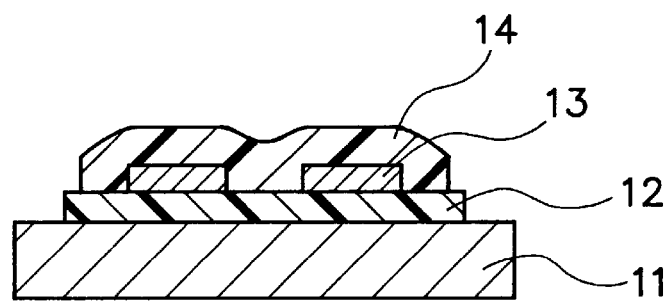
FIG. 5(a) is a cross section taken along the line A—A in FIG. 4.
Figure 5B:
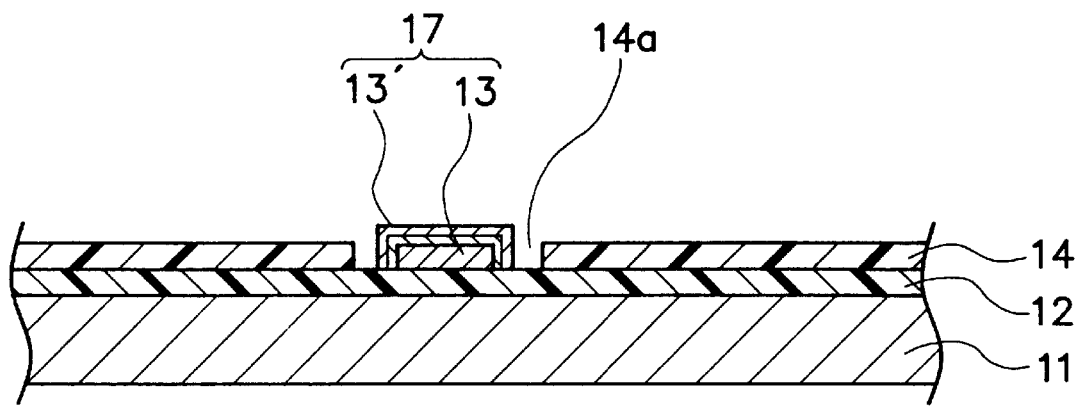
FIG. 5(b) is a cross section taken along the line B—B in FIG. 4.

FIG. 4 illustrates the flexure 10 as viewed from the front side. FIGS. 5(*a*) and 5(*b*) respectively illustrate cross sections taken along the line A—A and the line B—B in FIG. 4. As illustrated in FIGS. 4 and 5, the said flexure includes a plate shaped substrate 11, an insulating layer 12 laminated on the front side of the said substrate, a conductor layer 13 laminated on the said insulating layer and a protection layer 14 surrounding the said conductor layer. The substrate 11, the insulating layer 12, the conductor layer 13 and the protection layer 14 may be respectively a stainless-steel plate of SUS304 or the like having a thickness of approximately 15 to 30 micrometers, a polyimide insulating layer having a thickness of approximately 5 to 10 micrometers, a conductor layer including a Cu layer having a thickness of approximately 5 to 10 micrometers and a polyimide protection layer having a thickness of approximately 2 to 5 micrometers.

The substrate 11 is provided closer to the distal end thereof with a gimbal portion 11a with a magnetic-head-slider-mounting region 11b formed thereon. The gimbal portion 11a permits the magnetic head slider, which flies on air by the rotation of the magnetic disk, to pitch and roll following the disk surface.

The flexure wiring structure 15 formed by the conductor layer 13 includes a distal end region 15a for connection to the magnetic head slider, a proximal end region 15b forming a connection portion for connection to the relay FPC, and a flexure signal line portion 15c extending between the distal end region 15a and the proximal end region 15b.

The distal end region 15a includes a terminal pad 16 for connection to the slider, which is connected to a terminal of the magnetic head slider by Au ball bonding or the like.

The flexure signal line portion 15c is equal in conductor width to the proximal end region 15b, while it remains constant in conductor width at a given portion thereof in the lengthwise direction. The conductor width at the signal line portion 15c and the proximal end region 15b is, for example, in the range of approximately 30 to 60 micrometers.

As best illustrated in FIG. 5(*b*), the protection layer 14 of the proximal end region 15b defines an opening 14a, through which the conductor layer 13 is exposed to the outside. The said opening 14a has a width wider than that of the conductor layer 13 in the proximal end region 15b. The opening 14a is preferably dimensioned and configured so that the distance between the edge of the opening 14a formed in the protection layer 14 and the edge of the exposed conductor layer 13 becomes 10 to 20 micrometers.

As illustrated in FIGS. 5(*a*) and 5(*b*), the flexure wiring structure 15 is formed in the flexure signal line portion 15c only by the Cu layer 13, and in the proximal end region 15b by the Cu layer 13 and an Ni/Au-plated layer 13' surrounding the said Cu layer. Specifically, in this embodiment, the Cu layer 13 and the Ni/Au-plated layer 13' in the proximal end region 15b together form a connection portion 17 for connection to the relay FPC. The width of the said connection portion 17 is substantially equal to that of the signal line portion 15c. This substantial equalization in width between the connection portion 17 and the signal line portion 15c permits the capacity in a joining region between the flexure wiring structure 15 and the FPC wiring structure to decrease. The Ni/Au-plated layer 13' is to prevent the Cu layer 13 from corroding. The Ni layer and the Au layer each may have a thickness of approximately 1 micrometer. The connection portion 17 projects beyond the surface of the protection layer 14 so as to be connected to an FPC wiring structure, which will be described later.

The terminal pad 16 closer to the magnetic head slider is of a rectangular shape with each side of approximately 100 to 250 micrometers. Although not illustrated in the drawings, the protection layer 14 in the terminal pad 16 closer to the slider defines an opening, through which the conductor layer 13 is exposed. However, the opening of the protection layer in this portion has a width narrower than the width of the conductor layer 13 constituting the terminal pad 16 closer to the slider. The exposed surface of the conductor layer 13 is plated with Ni/Au (thickness: 1 micrometer/1 micrometer).

Figure 6:
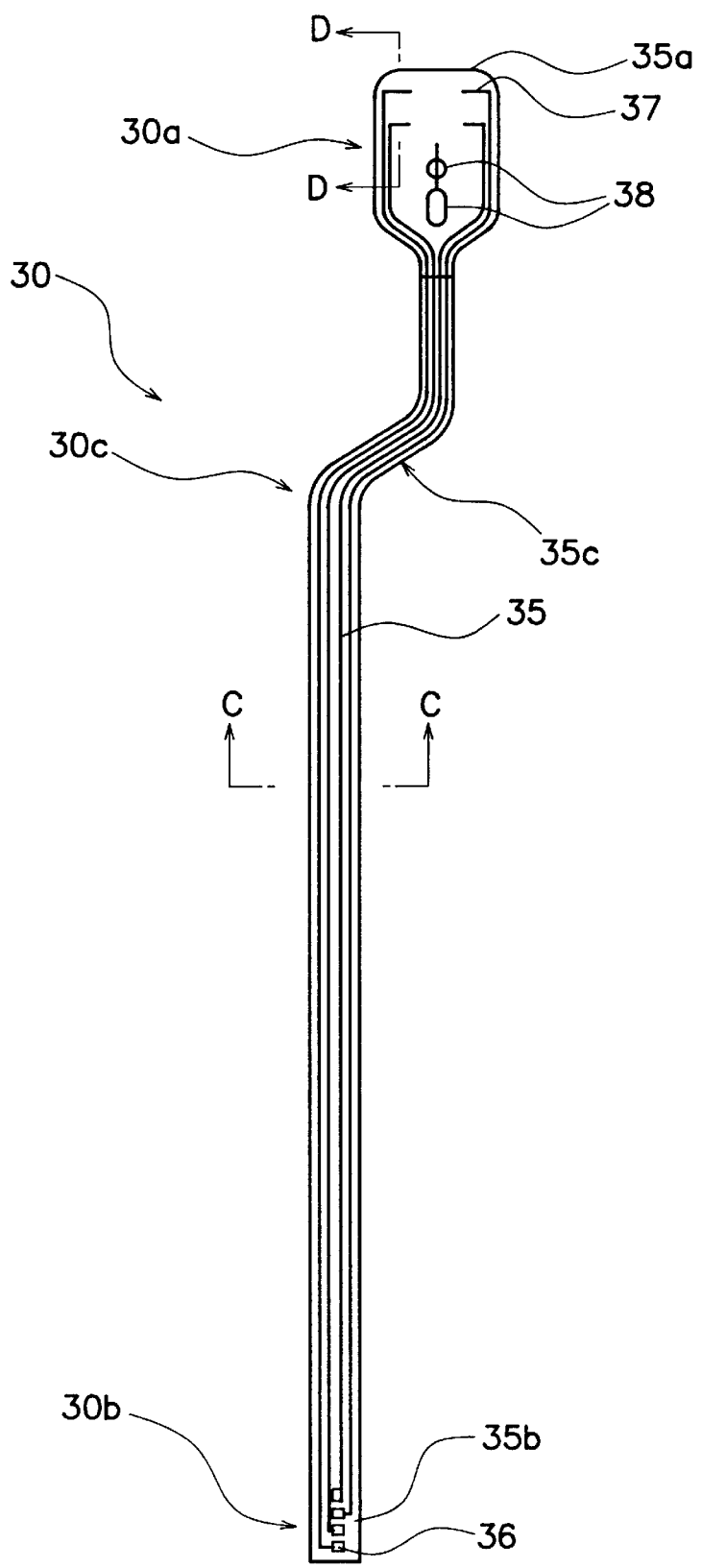
FIG. 6 is a front view illustrating a rear side of the relay FPC in the wiring integrated suspension of FIG. 1.
Figure 7A:
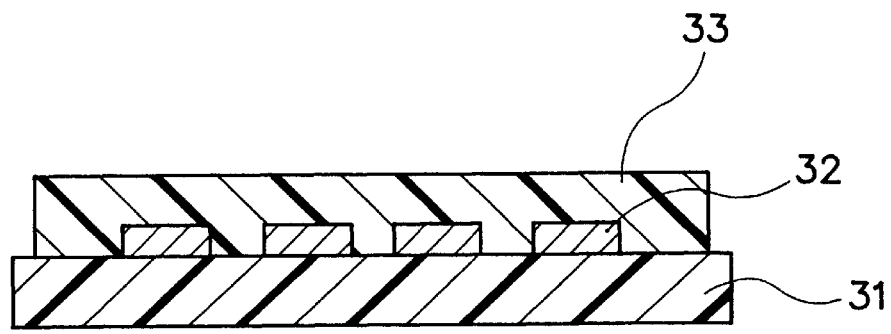
FIG. 7(a) is a cross section taken along the line C—C in FIG. 6.
Figure 7B:
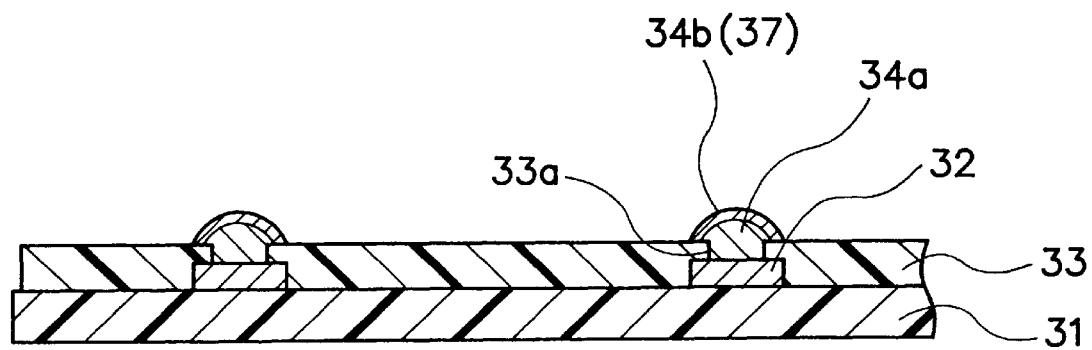
FIG. 7(b) is a cross section taken along the line D—D in FIG. 6.

FIG. 6 illustrates the rear side of the relay FPC 30. FIGS. 7(a) and 7(b) respectively illustrate cross sections taken along the line C—C and the line D—D in FIG. 6.

As best illustrated in FIGS. 7, the relay FPC 30 is of an elongated and plated shape, and includes a base layer 31, a conductor layer 32 laminated on the rear side of the said base layer 31 and a cover layer 33 surrounding the said conductor layer 32. The base layer 31, the conductor layer 32 and the cover layer 33 may be, for example, a polyimide base layer having a thickness of 10 to 20 micrometers, a conductor layer including a Cu layer having a thickness of 12 to 18 micrometers and a polyimide cover layer having a thickness of 15 to 25 micrometers.

As illustrated in FIG. 1, the relay FPC 30 includes a distal end portion 30a whose rear side is joined to the front side of the flexure 10 on the front side of the distal end region of the load beam 20. The relay FPC 30 includes a proximal end portion 30b for connection to the side of the arm (not illustrated). An intermediate portion 30c extending between the distal end portion 30a and the proximal end portion 30b is joined to the front side of the load beam 20 and the side of the arm.

The FPC wiring structure 35 formed by the conductor layer 32 includes a distal end region 35a for connection to the flexure wiring structure 15, a proximal end region 35b for connection to the preamplifier IC and an FPC signal line portion 35c extending between the distal end region 35a and the proximal end region 35b (see FIG. 6). The proximal end region 35b includes a terminal pad 36 for connection to the preamplifier IC, which is of, for example, a rectangular shape with each side of 250 to 500 micrometers.

As illustrated in FIG. 7(a), the conductor layer 32 in the signal line portion 35c is covered by the cover layer 33. On the other hand, the cover layer 33 in the distal end region 35a defines an opening 33a, through which the conductor layer 32 is exposed to the outside. On the exposed surface of the conductor layer 32 is formed a Cu-bump 34a, on which a solder plated layer 34b is formed. Specifically, in this embodiment, the solder plated layer 34b, which is electrically connected to the conductor layer 32, forms a connection portion 37 for connection to the flexure wiring structure 15. The Cu-bump 34a has such a thickness as to rise over the surface of the cover layer 33. The Cu-bump 34a preferably has a thickness of 20 to 80 micrometers. The solder plated layer 34b preferably has a thickness of 10 to 20 micrometers.

The FPC signal line portion 35c is equal in conductor width to the distal end region 35a, while it remains constant in conductor width at a given portion thereof in the lengthwise direction. The width of the conductor layer is, for example, in the range of approximately 60 to 100 micrometers. The edge of the opening 33a formed in the cover layer 33 is dimensioned and configured to be located 20 micrometers inwards with respect to the edge of the conductor layer 32. That is, the width of the opening 33a is approximately 40 micrometers narrower than the width of the conductor layer 32. This facilitates adjustment of the thickness of the Cu-bump 34a.

The distal end portion 30a of the relay FPC 30 is joined to the flexure 10 by applying an epoxy adhesive, etc., on the region other than the joining region between the FPC wiring structure 35 and the flexure wiring structure 15 (see FIG. 1). In joining them together, positioning the relay FPC 30 with respect to the flexure 10 is accomplished by inserting pins into the positioning holes 10b and 38 respectively defined in both parts 10 and 30. The relay FPC 30 is also joined to the front side of the load beam 20 and the side of the arm by using the epoxy adhesive, etc.

The characteristic impedance of the flexure signal line portion 15c is matched to that of the FPC signal line portion 35c by adjusting the conductor width, the space between the adjacent conductor layers, and the thickness of the insulating layer and the base layer in each portion.

The method for matching the characteristic impedance of the flexure signal line portion 15c to the FPC signal line portion 35c will be hereinafter described by taking for example the case that the characteristic impedance of the flexure signal line portion 15c is known, to which the characteristic impedance of the FPC signal line portion 35c has to be matched. The characteristic impedance in a wiring structure generally depends on the capacity, inductance and resistance of the said wiring structure. For the FPC signal line portion 35c, its capacity is determined mainly by the width of the conductor layer, the space between the conductor layer and a metal plate such as the load beam located under the said conductor layer, and the dielectric constant of matters existing in this space. The inductance and resistance of the FPC signal line portion 35c are determined by the width of the conductor layer, the space between the adjacent conductor layers, and overcurrent flowing through the metal plate. This overcurrent depends on the space between the conductor layer and the metal plate located under the said conductor layer, if the width of the conductor layer and the space between the adjacent conductor layers remain constant. The space between the FPC signal line portion 35c and the metal plate such as the load beam is determined by the thickness of the polyimide cover layer 33. Therefore, the characteristic impedance of the FPC signal line portion 35c is adjustable by the width of the conductor layer 32, the space between the adjacent conductor layers 32, and the thickness of the polyimide cover layer 33.

According to the test results obtained by the inventor, when the insulating layer 12 of the flexure 10 has a thickness of 10 micrometers, and the width of each conductor layer 13 and the space between the adjacent conductor layers 13 are respectively 40 micrometers and 40 micrometers, the characteristic impedance of the flexure signal line portion 15 became approximately 100 Ω at a signal frequency of 200 MHz. On the other hand, when the width of each conductor layer 32 of the FPC signal line portion 35c and the space between the adjacent conductor layers 32 are respectively 80 micrometers and 80 micrometers, and the thickness of the polyimide cover layer 33 of the relay FPC is approximately 25 micrometers, it has been found that the characteristic impedance of the FPC signal line portion 35c becomes approximately 100 Ω at a signal frequency of 200 MHz.

Figure 8:
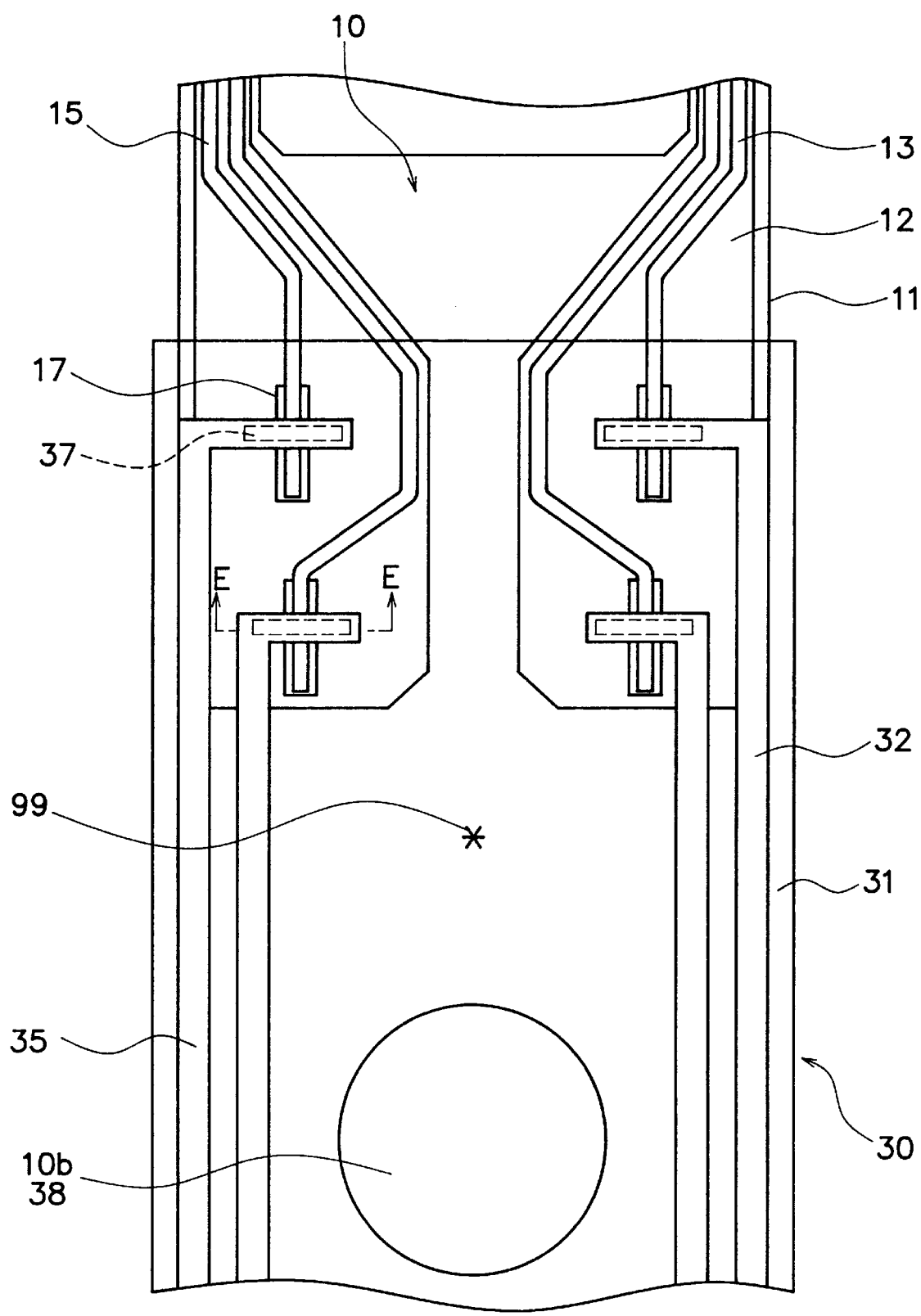
FIG. 8 is an enlarged view of a joining region between a flexure wiring structure and an FPC wiring structure as viewed from a disk-facing side of the joining region.

FIG. 8 is an enlarged view of a joining region between the flexure wiring structure 15 and the FPC wiring structure 35 as viewed from a disk-facing side of the joining region. FIG. 9 is a cross section taken along the line E—E in FIG. 8.

As illustrated in FIGS. 8 and 9, the flexure wiring structure 15 is joined to the FPC wiring structure 35 via the connection portion 17 of the flexure wiring structure and the connection portion 37 of the FPC wiring structure. This joining is accomplished by the following method. Specifically, the relay FPC 30 is overlapped on the flexure 10 and brought into a predetermined position on the flexure 10 by using the holes 10b and 38. The relay FPC 30 is, then, pressed to the flexure 10 while heating them to 250 to 300.degree. C. Thereby, the solder plated layer 34b is melted, permitting the surface of the connection portion 17 to wet. The flexure wiring structure 15 is, then, joined to the FPC wiring structure 35 by cooling.

The connection portion 37 of the FPC wiring structure 35, or the solder plated layer 34b is substantially equal in width to the conductor layer 32 of the FPC signal line portion 35c so as to reduce the capacity in the joining region between the flexure wiring structure 15 and the FPC wiring structure 35. The width of the said solder plated layer 34b is adjustable by the following method. Specifically, the Cu-bump 34a and the solder plated layer 34b are usually formed by electrolytic plating, so that the portion rising over the thickness of the polyimide cover layer 33 grows not only in the thickness direction, but also in the lateral direction. Accordingly, when the relay FPC 30 includes the conductor layer 32 having a width of 80 micrometers in the distal end region 30a, the polyimide cover layer 33 on the said conductor layer having a thickness of 20 micrometers, the said cover layer 33 defining the opening 33a having a width of 40 micrometers (see FIG. 7(b)), the Cu-bump 34a having a thickness of 30 micrometers and the solder plated layer 34b having a thickness of 10 micrometers, the solder plated layer 34b can increase in width to approximately 80 micrometers that is equal to the width of the said conductor layer due to the fact that the solder plated layer 34b grows not only in the thickness direction, but also in the lateral direction. The conductor layer in the distal end region 30a of the relay FPC is, as described above, equal in width to the conductor layer in the FPC signal line portion 30c.

Next, the length La of the connection portion 17 of the flexure wiring structure 15 will be described. The length La of the said connection portion 17 is determined by multiplying a positional error ΔL in joining between the flexure 10 and the relay FPC 30 by two, and adding the result to the width of the connection portion 37 of the FPC wiring structure 35, or the width of the solder plated layer 34b.

The positional error ΔL depends on the dimensional error of the positioning holes 10b and 38 for use in positioning the flexure 10 and the relay FPC 30. The positioning holes are usually formed by etching, so that the dimensional error of each positioning hole increases to approximately the same size as the thickness of a layer, in which the said each positioning hole is formed. Specifically, ΔL can be represented by the following formula (1):

$$\Delta L = (ts + tf) \times A \quad (1)$$

in which ts represents the thickness of a layer, in which a corresponding positioning hole is formed, among the layers constituting the flexure 10, and tf represents the thickness of a layer, in which a corresponding positioning hole is formed, among the layers constituting the relay FPC 30. A represents the safety factor that is variable according to conditions such as a manufacturing apparatus. This safety factor has been empirically found to lie in the range of A=2 to 4, as a result of the study by the inventor.

Taking for example the case where the positioning holes 10b of the flexure are formed in the stainless-steel substrate 11, and the positioning holes 38 of the relay FPC are formed in the base layer 31, openings larger in diameter than the positioning holes are respectively formed in the insulating layer 12 and the protection layer 14 of the flexure, as well as in the cover layer 33 of the relay FPC, so that these layers do not influence the positional error in joining between the flexure 10 and the relay FPC 30. As described above, the substrate 11 of the flexure 10 has a thickness of 15 to 30 micrometers, the base layer 31 of the relay FPC 30 has a thickness of 10 to 20 micrometers, so that the positional error ΔL in this embodiment becomes ΔL=(25 to 50 micrometers)×(2 to 4)=0.1 to 0.2 mm, according to the formula (1).

For the convenience of explanation, the case where the substrate 11 of the flexure has a thickness of 25 micrometers, the base layer 31 of the relay FPC has a thickness of 15 micrometers and the safety factor A is 3, is taken for example. The positional error ΔL becomes ΔL=(25 micrometers+15 micrometers)×3=0.12 mm (=120 micrometers). Accordingly, when the width of the connection portion 37 of the FPC wiring structure 35 is 80 micrometers, as described above, the length La of the connection portion 17 of the flexure wiring structure 15 becomes La=0.12 mm×2+80 micrometers=0.32 mm.

On the other hand, the length Lb of the connection portion 37 (the solder plated layer 34b in this embodiment) of the FPC wiring structure 35 is determined by multiplying the positional error ΔL by two, and adding the result to the width of the connection portion 17 of the flexure wiring structure 15. Accordingly, when the positional error ΔL is ΔL=0.12 mm, and the width of the connection portion 17 is 40 micrometers, the length Lb of the connection portion 37 of the FPC wiring structure 35 becomes 0.28 mm.

The reason for adjusting the length of the connection portion 17 of the flexure wiring structure 15 and the length of the connection portion 37 of the FPC wiring structure 35 according to the above described manner will be described hereinbelow.

FIGS. 10(a) to 10(c) illustrate various joining states between the connection portion 17 of the flexure wiring structure and the connection portion 37 of the FPC wiring structure. FIG. 10(a) illustrates a joining state where the flexure 10 is joined to the relay FPC 30 as described in a design plan, that is, the positional error is 0. FIGS. 10(b) and 10(c) respectively illustrate joining states where the relay FPC 30 is joined to the flexure 10 with positional errors of 0.12 mm in the forward direction of x-axis and 0.12 mm in the forward direction of y-axis, and 0.12 mm in the reverse direction of x-axis and 0.12 mm in the reverse direction of y-axis.

As illustrated in FIGS. 10(b) and 10(c), by setting the length of the connection portion 17 of the flexure wiring structure to a value determined by multiplying the positional error ΔL by two and adding the result to the width of the connection portion 37 of the relay FPC, and by setting the length of the connection portion 37 of the FPC wiring structure to a value determined by multiplying the positional error ΔL by two and adding the result to the width of the connection portion 17 of the flexure wiring structure, the positional error along either x- or y-axis in joining between the flexure 10 and the relay FPC 30 does not prevent a proper joining between the flexure wiring structure 15 and the FPC wiring structure 35.

Next, the capacity in the joining region between the connection portion 17 of the flexure wiring structure and the connection portion 37 of the FPC wiring structure will be discussed hereinbelow. The capacity of the said joining region depends greatly on the dimension of each part in the connection portions 17 and 37, which part does not contribute to signal transmission. Specifically, in FIG. 10(a), the capacity in the joining region is determined according to the dimension of an extension 17a of the connection portion 17 of the flexure wiring structure, which extends beyond the connection portion 37 of the FPC wiring structure and the dimension of an extension 37a of the connection portion 37 of the FPC wiring structure, which extends beyond the connection portion 17 of the flexure wiring structure. Accordingly, the capacity in the said joining region becomes zero in the case as illustrated in FIG. 10(b), and maximum in the case as illustrated in FIG. 10(c).

According to the test results obtained by the inventor, for the flexure 10 with the polyimide insulating layer 12 having a thickness of 10 micrometers and the polyimide protection layer 14 having a thickness of 3 micrometers, the capacity in the joining region was approximately 0.04 pF even in the case as illustrated in FIG. 10(c), in which the capacity of the joining region becomes maximum. On the contrary, the capacity of the conventional terminal pads with the connection portion of the flexure wiring structure and the connection portion of the FPC wiring structure, each connection portion having a rectangular shape with each side of 0.4 to 0.5 mm, is 0.4 to 0.6 pF, as described above. Therefore, the capacity in the joining region according to this embodiment is one tenth or less of the capacity in the said conventional terminal pads.

The capacity in the joining region according to this embodiment was compared with the capacity in the arrangement where the connection portion of the flexure wiring structure and the connection portion of the FPC wiring structure are terminal pads whose joining region has an area size equal to that of the joining region in this embodiment. The joining region according to this embodiment has an area size determined by multiplying the width of the connection portion 17 of the flexure wiring structure by the width of the connection portion 37 of the FPC wiring structure (namely, 0.04 mm×0.08 mm=0.0032 mm$^2$). In this embodiment, even a positional error of 0.12 mm has occurred between the flexure and the relay FPC, the area for the joining region can be maintained. On the other hand, for the relay FPC wiring structure and the flexure wiring structure each including the connection portion of a pad shape, even for a positional error of 0.12 mm, it is necessary to have a pad size of 0.18 mm×0.18 mm for each of the connection portions of the flexure wiring structure and the FPC wiring structure so as to maintain the joining region having an area size of 0.0032 mm$^2$. The capacity of the pads for the flexure and the relay FPC joined together via the said pads with positional errors of 0.12 mm along both x- and y-axes becomes approximately 0.09 pF, which is twice or more as much as the case of FIG. 10(c). Therefore, the capacity in the joining region according to this embodiment can be smaller, even in comparison with the arrangement where the joining region between the pad shaped connection portions of the flexure wiring structure and the FPC wiring structure has an area size equal to that in this embodiment.

Figure 11:
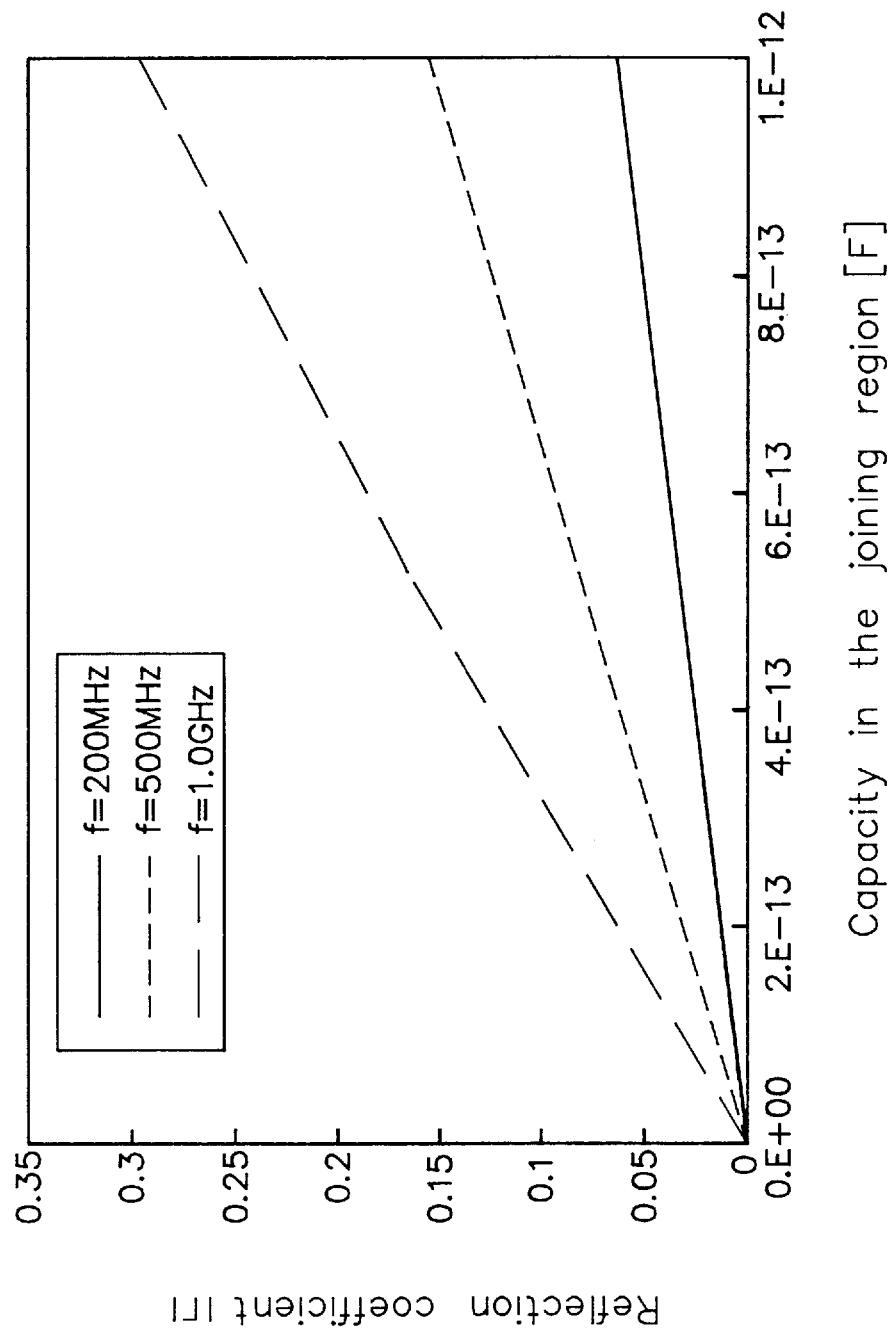
FIG. 11 is a graph illustrating the reflection coefficient F in the joining region on various values of the capacity dependence in the case that high frequency signals are entered into the wiring structures joined together via the connection portions.

FIG. 11 is a graph illustrating the reflection coefficient Γ in the joining region on various values of the capacity dependence in the case that high frequency signals are entered into the wiring structures joined together via the connection portions. In the wiring structures, a wire having a resistance of 180 Ω/m, a capacity of 50 pF/m and an inductance of 500 nH/m was used. The reflection coefficient Γ represents the reflection coefficient in the joining region as viewed from the FPC signal line portion 35c based upon the presumption that the flexure signal line portion 15c and the FPC signal line portion 35c are treated as transmission lines, and the end portion of the flexure wiring structure closer to the magnetic head slider terminates with a load resistance of a value Zc.

For the connection using the terminal pads having a capacity of 0.4 to 0.6 pF in the joining region at a signal frequency of, for example, 1.0 GHz, the reflection coefficient becomes in the order of |Γ|=0.12 to 0.18, which results in a high possibility to adversely influence the signal transmission. Contrarily, in this embodiment, the capacity in the joining region is 0.04 pF as a maximum value (in the case of FIG. 10(c)), the reflection coefficient becomes in the order of |Γ|=0.013. That is, in this embodiment, the reflection coefficient in the joining region between the flexure wiring structure 15 and the FPC wiring structure 35 can be reduced to one tenth or less of that resulted from the conventional arrangement where the terminal pads each having a dimension of 0.4 to 0.5 mm×0.4 to 0.5 mm are used. Even for the terminal pads of 0.18 mm×0.18 mm, the reflection coefficient in the joining region becomes |Γ|=0.028. Therefore, the reflection coefficient in the joining region according to this embodiment can be reduced to not more than one second even in comparison with such a case.

The capacity in the joining region between the flexure wiring structure 15 and the FPC wiring structure 35 can be thus reduced in this embodiment, thereby reducing the signal reflection generated in the said joining region, and therefore stabilizing the signal transmission.

In this embodiment, the flexure wiring structure 15 is connected to the FPC wiring structure 35 in the distal end region of the load beam 20 adjacent to the gimbal portion 11a of the flexure 10, so that the flexure can be reduced to such a dimension as to be smaller than the conventional wiring integrated suspension as described above. Thus, the manufacturing cost of the flexure can be reduced.

Figure 12:
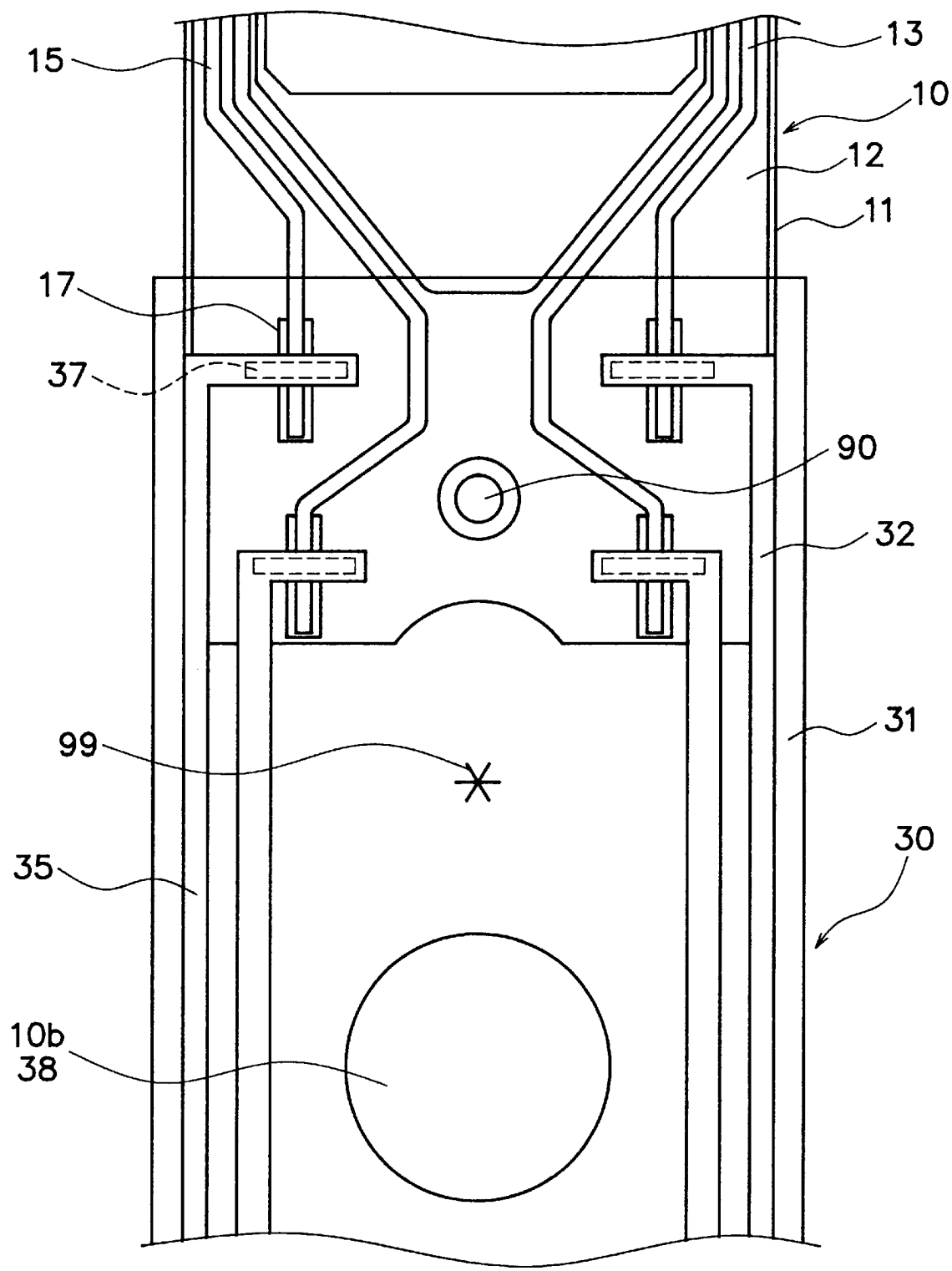
FIG. 12 illustrates another example of the wiring integrated suspension of FIG. 1.

As illustrated in FIG. 12, dummy pads 90 are preferably formed respectively on the flexure 10 and the relay FPC 30 within an overlapping region in such a manner as to be electrically and respectively isolated from the flexure wiring structure 15 and the FPC wiring structure 35. More preferably, the said dummy pads 90 are formed in proximity to the connection portions of the flexure wiring structure 15 and the FPC wiring structure 35. The said dummy pads 90 can further strengthen the joining strength between the flexure 10 and the relay FPC, thereby providing improved connection reliability between the flexure wiring structure 15 and the FPC wiring structure 35. The dummy pads 90 each may be of the structure similar to that as described in FIGS. 5(b) and 7(b), and may be joined together by soldering.

Figure 13:
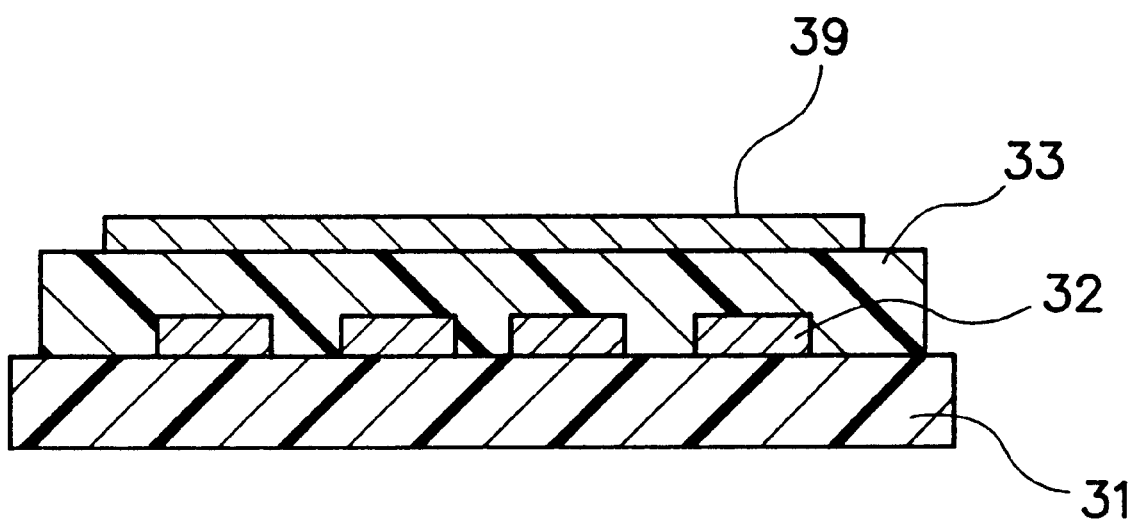
FIG. 13 is a vertical cross section of an FPC signal line portion with a ground conductor layer therein.

A ground conductor layer 39 may be formed on the surface of the polyimide cover layer 33 of the relay FPC 30, which extends over the entire surface region corresponding to at least the conductor layer 32 of the relay FPC 30 with the exception of the surface region for connection to the flexure wiring structure. The said ground conductor layer 39 can be bonded to the stainless-steel substrate 11 of the flexure 10 or the load beam 20 by using a conductive adhesive. FIG. 13 is a vertical cross section in the signal line portion of the relay FPC equipped with the ground conductor layer 39. With this arrangement as illustrated, the characteristic impedance of the signal line portion 35c in the FPC wiring structure 35 can remain uniform throughout the lengthwise direction of the said signal line portion, so that the signal reflection in the said signal line portion can effectively be prevented.

Specifically, the resistance, capacity and inductance of a wiring structure, which influences the characteristic impedance of the said wiring structure, is varied in accordance with the distance between the wiring structure and a metal plate closely adjacent to the said wiring structure. Therefore, in order to permit the characteristic impedance of the FPC signal line portion 35c to remain constant throughout the lengthwise direction, it is necessary to maintain the distance between the said signal line portion 35c and the load beam 20 or the arm constant throughout the lengthwise direction of the said signal line portion. However, it is necessary to dispose the relay FPC as avoiding the load-bent portion of the load beam, the base plate, etc., in order to prevent damages to the said relay FPC during a process for forming the load-bent portion of the load beam 20, or a process for joining the load beam 20 to the arm. Therefore, it is difficult to maintain the distance between the FPC signal line portion 35c and the load beam or the arm constant throughout the lengthwise direction of the said signal line portion.

On the contrary, when equipping the ground conductor layer 39, it functions as a metal plate closely adjacent to the FPC signal line portion 35c, so that the distance between the signal line portion 35c and the metal plate closely adjacent thereto can remain constant throughout the lengthwise direction of the said signal line portion. Further, the ground conductor layer 39 is electrically connected to the stainless-steel substrate 11 and the load beam 20, and fixed to a ground electric potential. Therefore, the ground conductor layer 39 can maintain the characteristic impedance of the FPC signal line portion 35c constant throughout the lengthwise direction, thereby removing the signal reflection in the said signal line portion.

In this embodiment, the description was made for the suspension with the base plate 180 used therein. However, it is possible to produce the same effects as describe above even in the suspension of the arrangement where the load beam 20 is directly welded to the arm without using the base plate.

It is also possible to connect the flexure wiring structure 15 to the FPC wiring structure 35 by using a conductive adhesive instead of the Cu-bump 34a and the solder plated layer 34b.

Embodiment 2

Figure 14A:
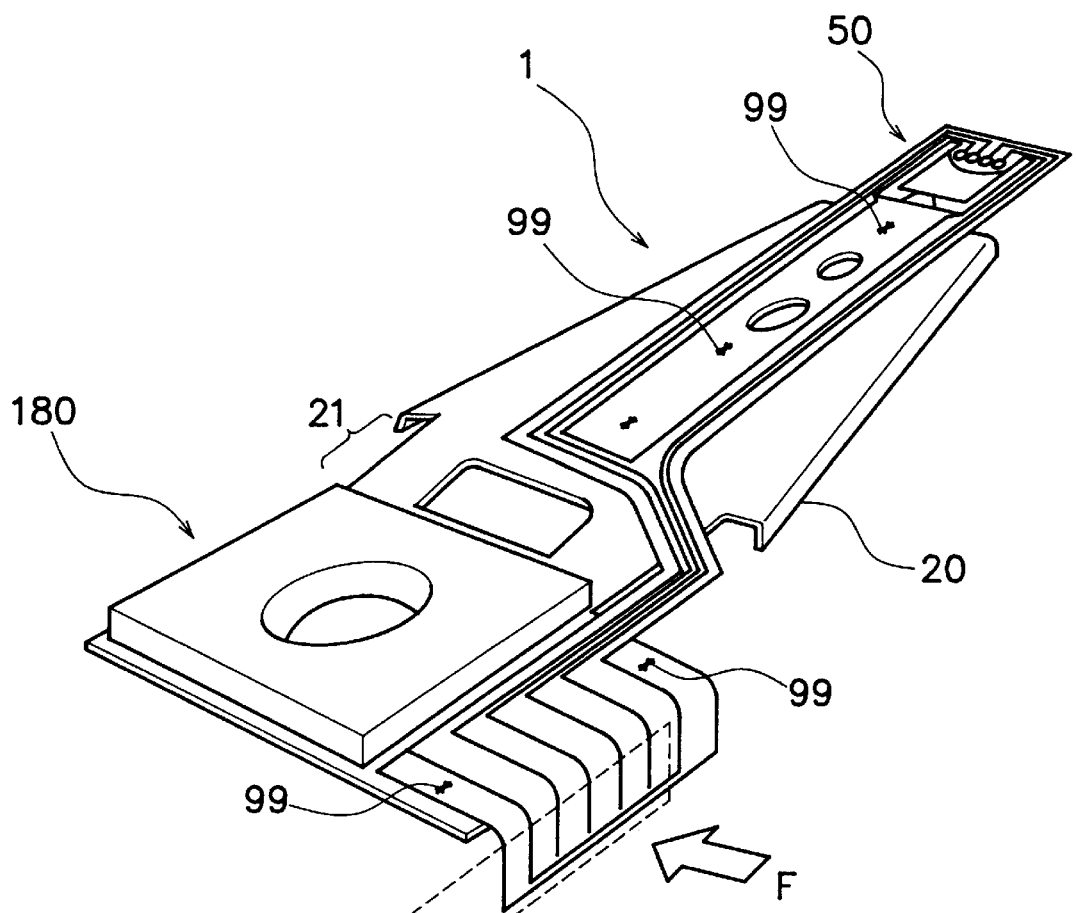
FIG. 14(a) is a perspective view illustrating a wiring integrated suspension according to a second embodiment of the present invention.
Figure 14B:
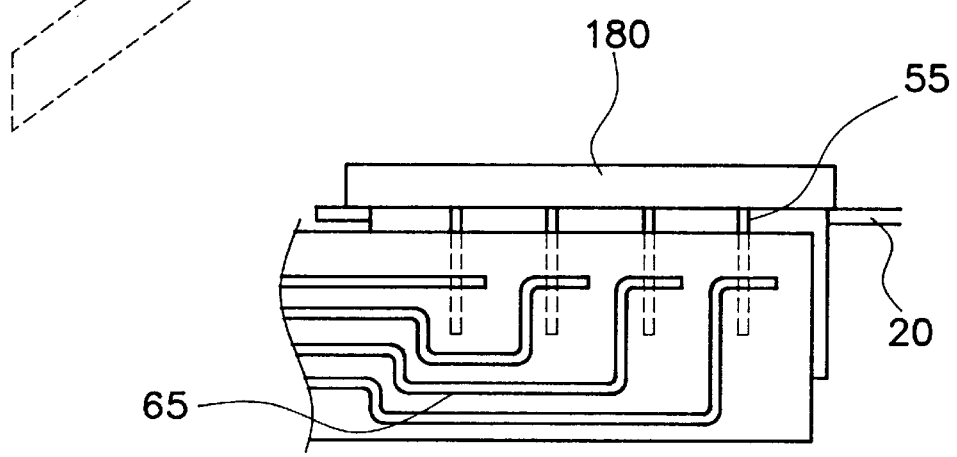
FIG. 14(b) is a side view illustrating the wiring integrated suspension as viewed in the direction of the arrow F in FIG. 14(a).

A second embodiment of the wiring integrated suspension according to the present invention will be hereinafter described with reference to the accompanying drawings. FIGS. 14(a) and 14(b) are respectively a perspective view illustrating a wiring integrated suspension 1', and a side view of the suspension as viewed in the direction of the arrow F in FIG. 14(a), in which corresponding or identical parts to those of the first embodiment have been given the same reference characters to omit a detailed description thereof.

The wiring integrated suspension 1' is equipped with a flexure 50 and a relay FPC 60 instead of the flexure 10 and the relay FPC 30 in the first embodiment. As illustrated in FIG. 14, the said flexure 50 has a proximal end portion passing over the load-bent portion (elastic portion) 21 to the proximal end portion of the load beam 20, in which it is curved so as to be fitted along a vertical surface of the proximal end portion of the load beam, and is connected at such a curved portion to the relay FPC 60. The structure for connection between the flexure wiring structure 55 and the FPC wiring structure 65 is the same as that in the first embodiment.

In addition to the effects produced by the suspension according to the first embodiment, the suspension of this embodiment produces another effect that can prevent the variation of the load effected by the load-bent portion 21 of the load beam 20. Specifically, when connecting the flexure wiring structure to the FPC wiring structure in the first embodiment, a pressing force is applied to the load beam directing from the front side to the rear side. The said pressing force applies a load to the load-bent portion of the load beam in the opposite direction to the bending direction of the said load-bent portion. Therefore, there was a likelihood of varying the load effected by the load-bent portion of the load beam during a process for connecting the flexure wiring structure to the FPC wiring structure in the first embodiment.

On the contrary, the load is applied to the load beam 20 in the lateral direction of the load beam 20 at the time of connecting the flexure wiring structure 55 to the FPC wiring structure 65 in this embodiment, as illustrated in FIG. 14(a). Therefore, it is unlikely to produce such an undesirable effect in this embodiment.

Embodiment 3

Figure 15:
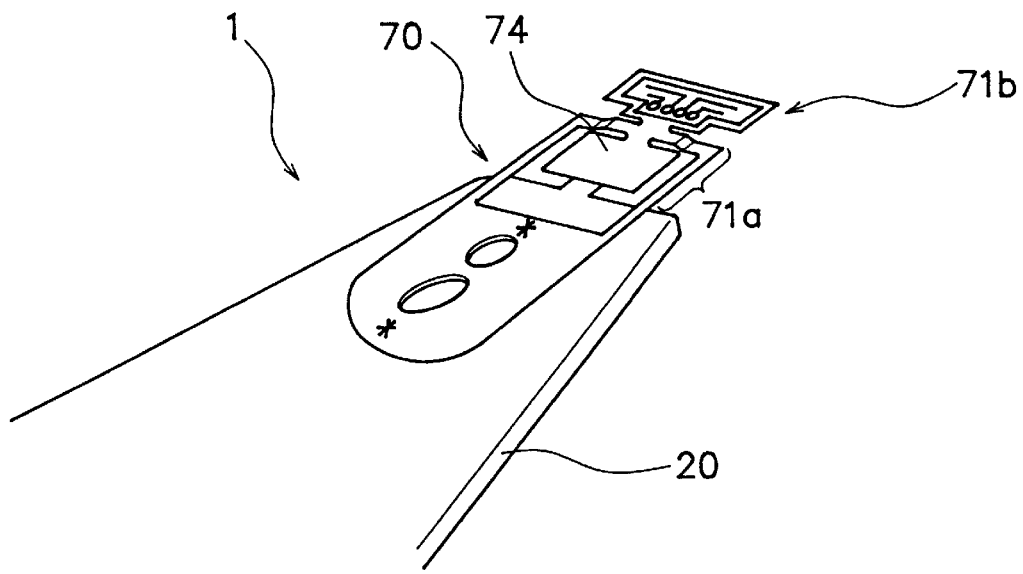
FIG. 15 is a perspective view illustrating a wiring integrated suspension according to a third embodiment of the present invention prior to mounting the relay FPC thereon.
Figure 16:
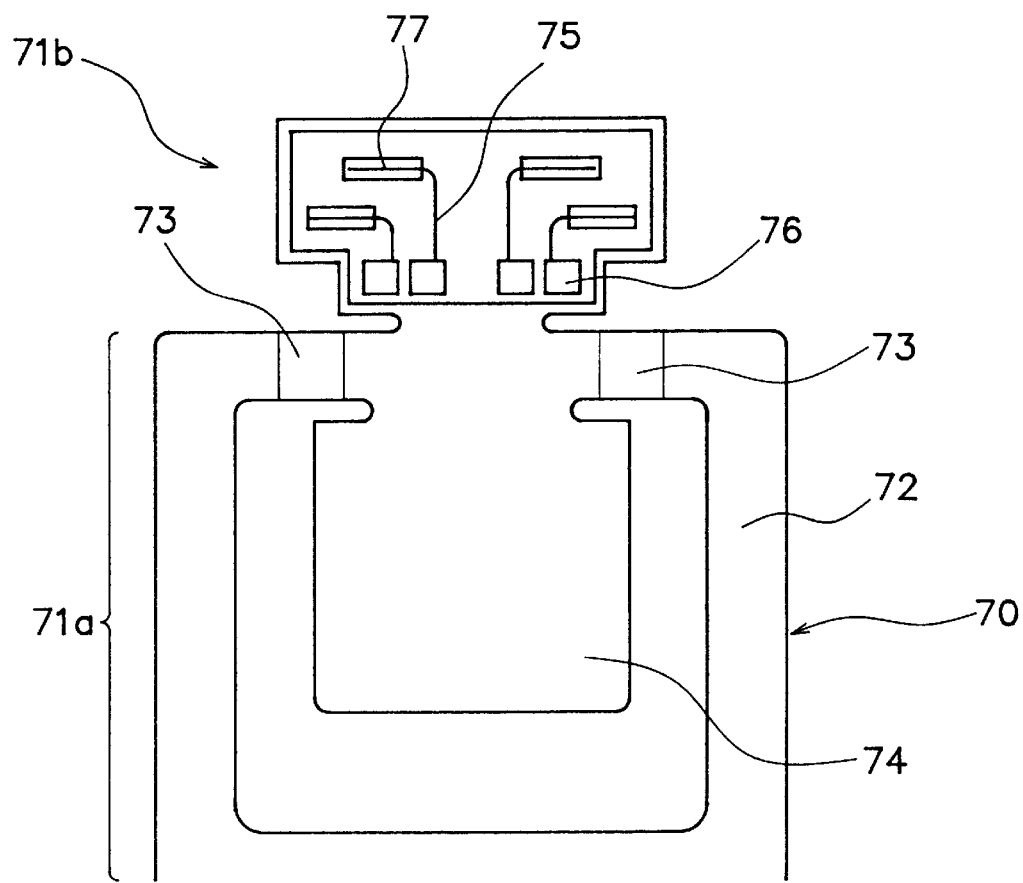
FIG. 16 is a front view illustrating a front side of the flexure in the wiring integrated suspension of FIG. 15.
Figure 17:
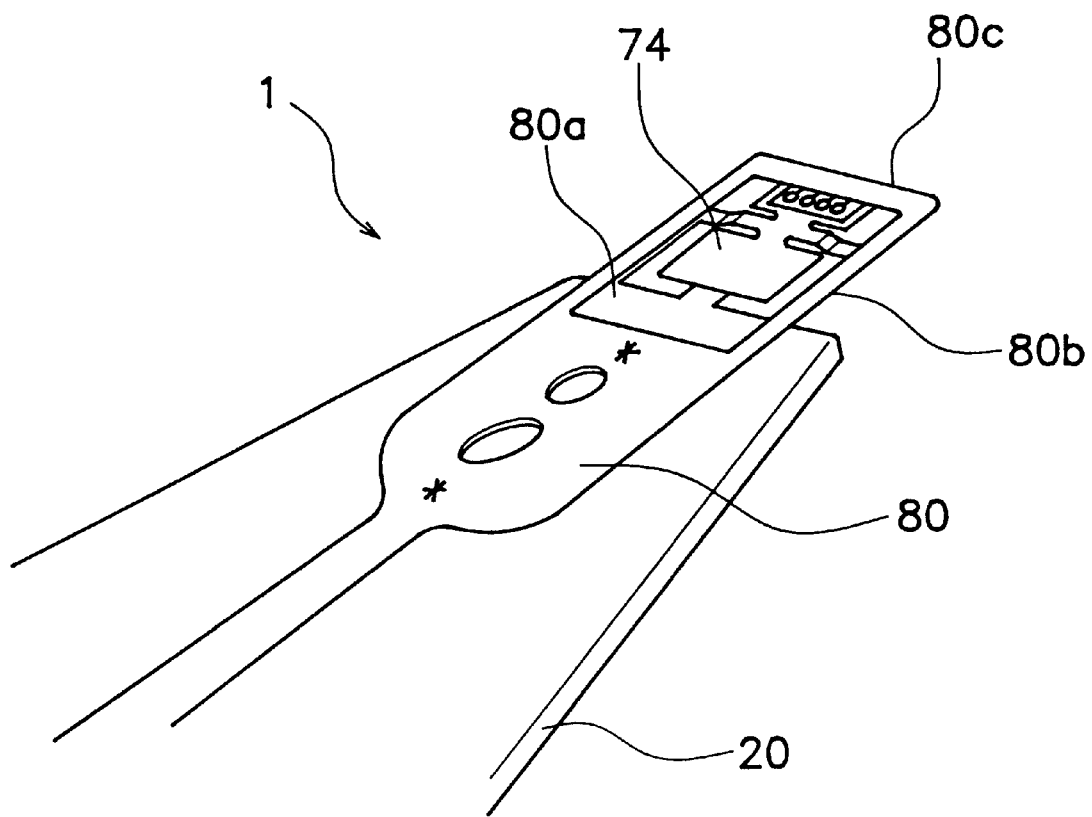
FIG. 17 is a perspective view illustrating the wiring integrated suspension according to the third embodiment of the present invention.
Figure 18:
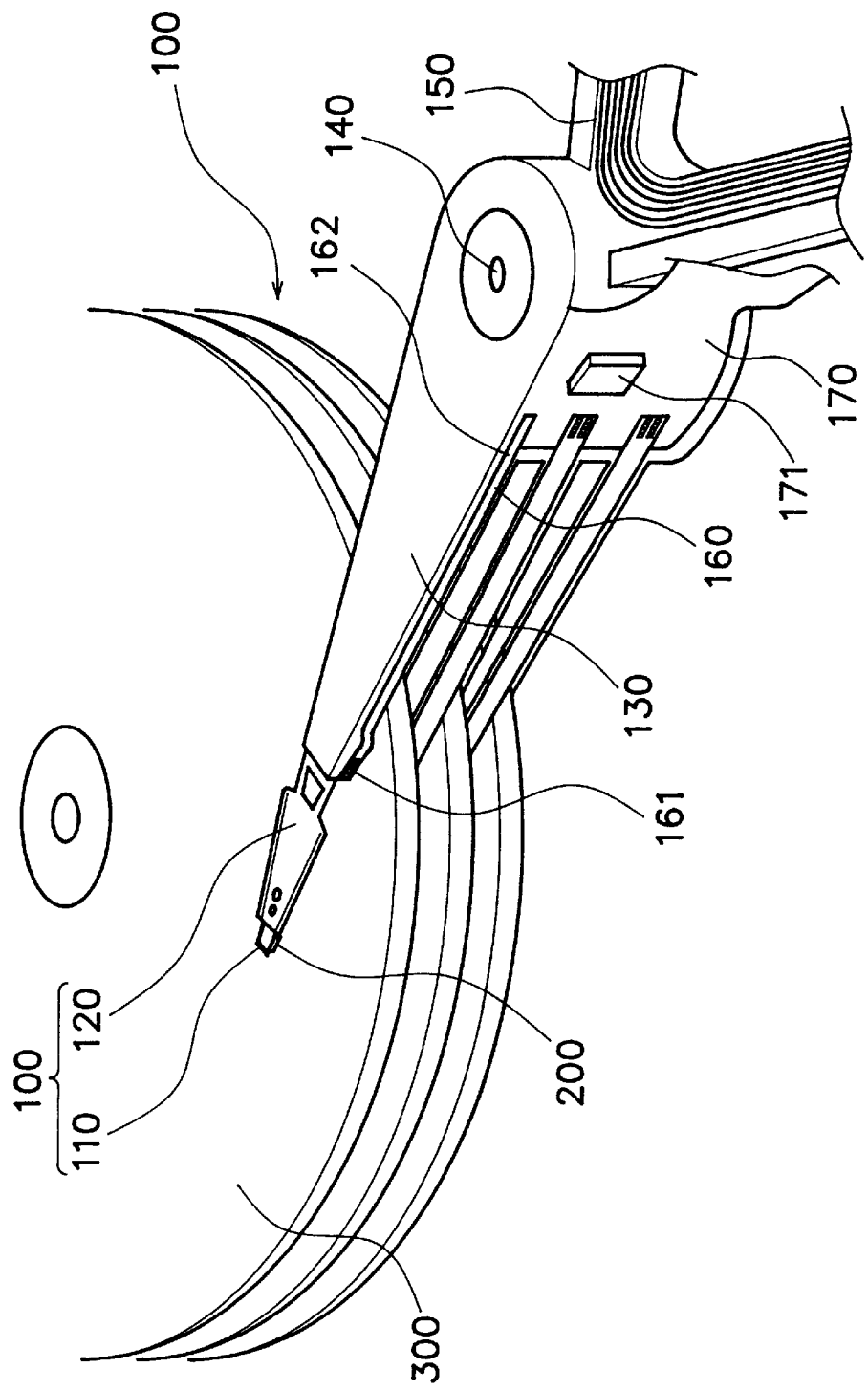
FIG. 18 is a perspective view illustrating the wiring integrated suspension installed within a HDD.
Figure 19:
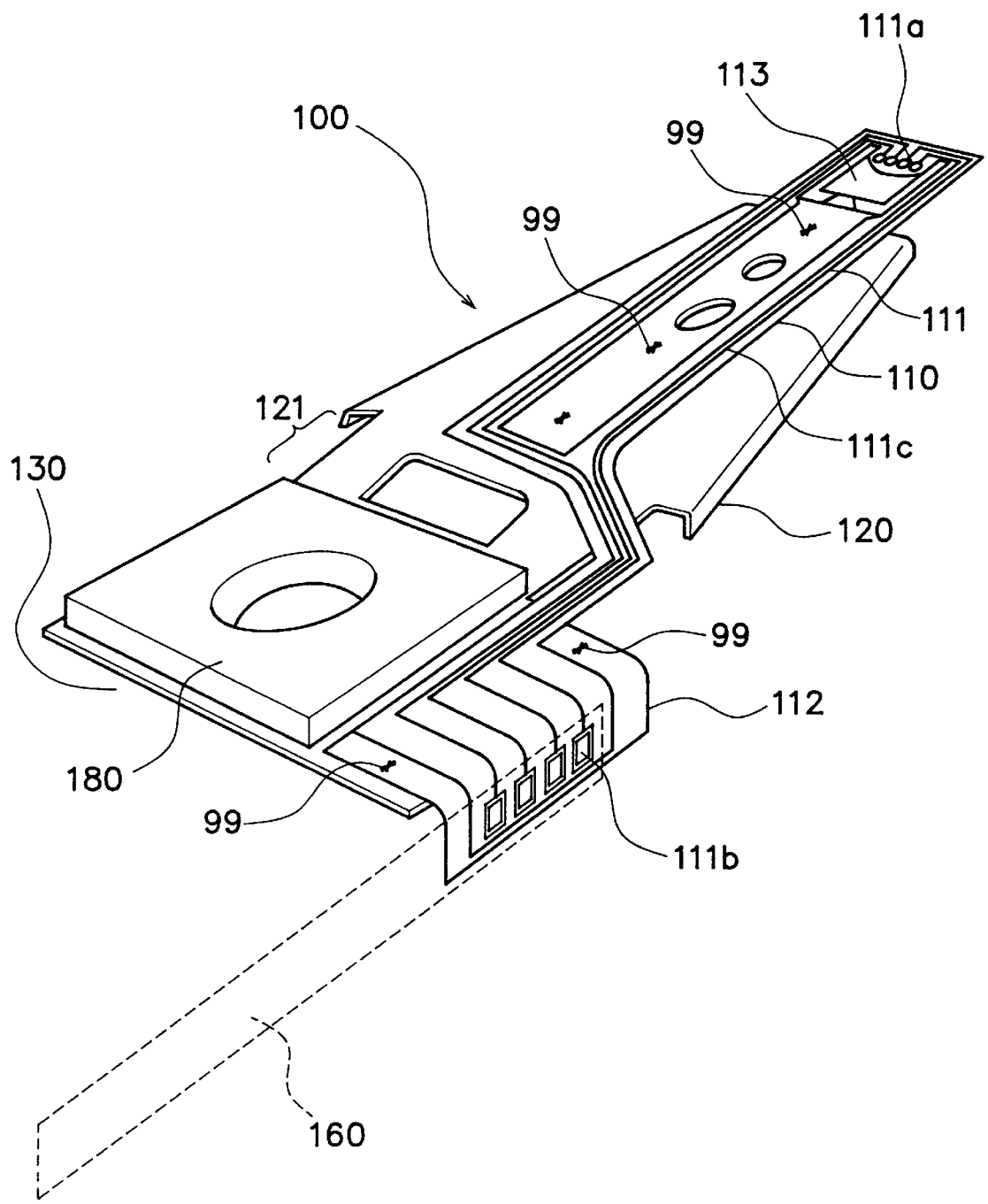
FIG. 19 is a perspective view illustrating a wiring integrated suspension of a conventional type.
Figure 20:
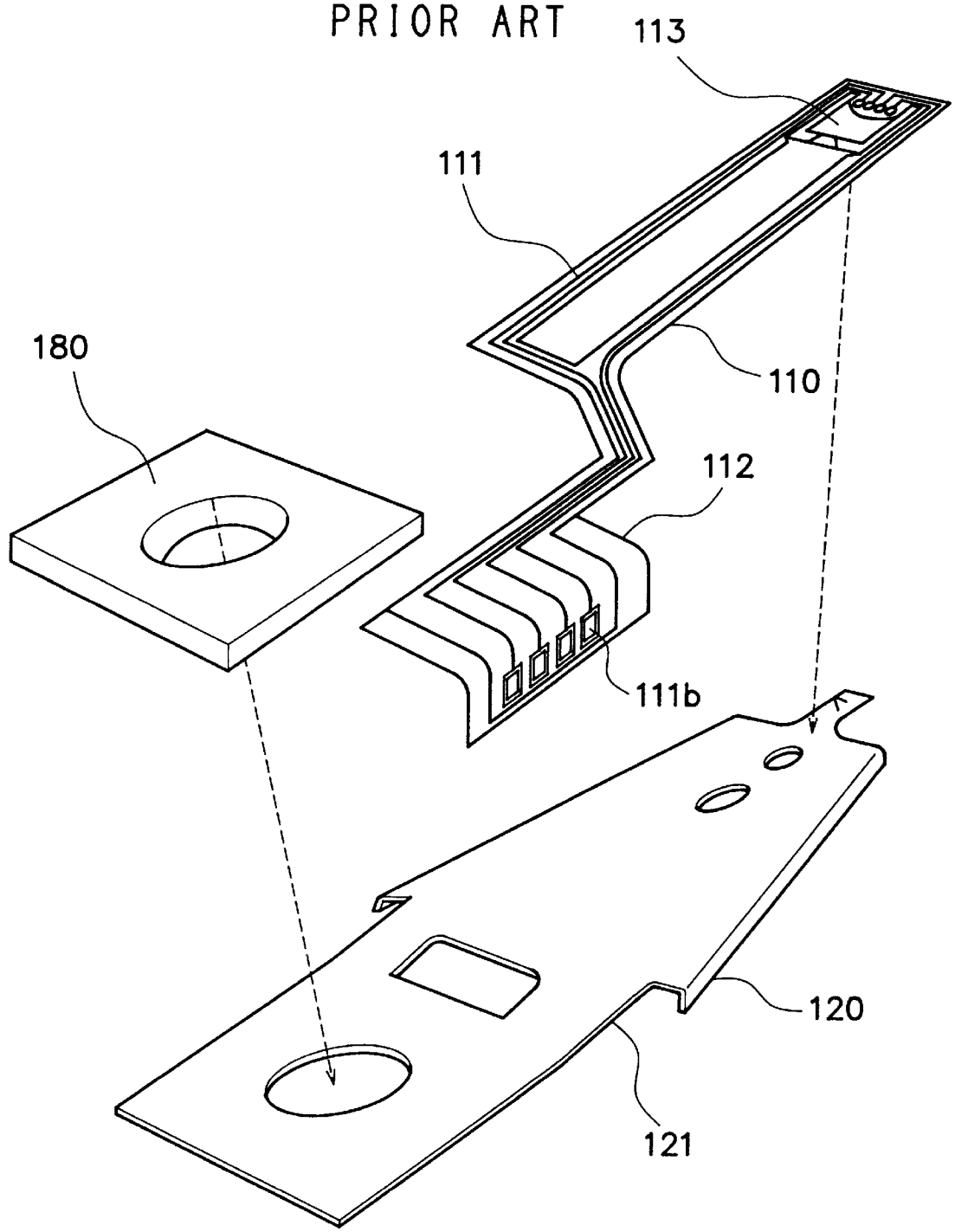
FIG. 20 is an exploded perspective view illustrating the wiring integrated suspension of FIG. 19.
Figure 21A:
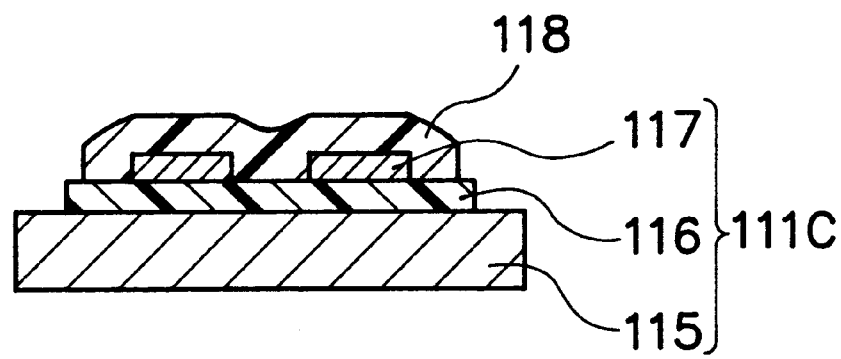
FIG. 21(a) is a vertical cross section of a flexure signal line portion in the wiring integrated suspension of FIG. 19.
Figure 21B:
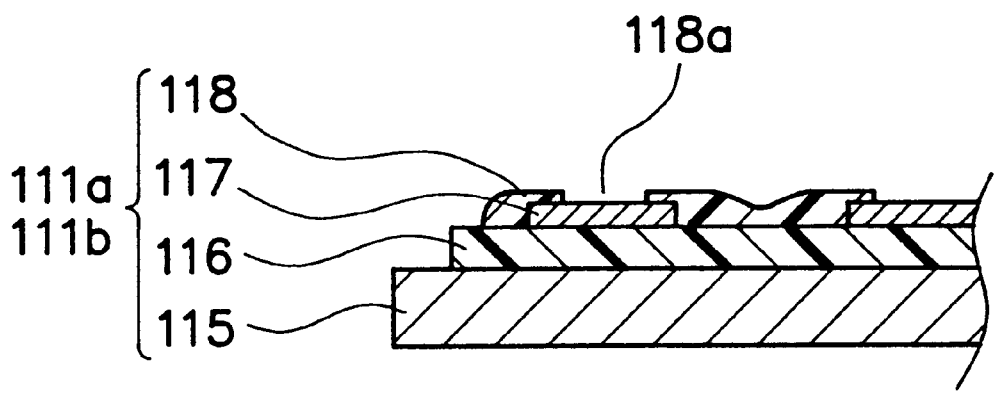
FIG. 21(b) is a vertical cross section of a terminal pad of the flexure wiring structure in the wiring integrated suspension of FIG. 19.

A third embodiment of the wiring integrated suspension according to the present invention will be hereinafter described with reference to the accompanying drawings. FIGS. 15 and 16 are respectively a perspective view illustrating a wiring integrated suspension 1" prior to mounting the relay FPC thereon, and an enlarged surface view of a flexure 70 in the suspension 1". FIG. 17 is a perspective view illustrating the wiring integrated suspension 1" after mounting the relay FPC thereon. In these figures, corresponding or identical parts to those of the first and second embodiments have been given the same reference characters to omit a detailed description thereof.

The wiring integrated suspension 1" is equipped with a flexure 70 and a relay FPC 80 instead of the flexure 10 and the relay FPC 30 in the first embodiment.

As illustrated in FIGS. 15 and 16, the flexure 70 is equipped with a connection stage 71b distally extending from the distal end of a gimbal portion 71a which includes a magnetic-head-slider-mounting region 74. The flexure wiring structure 75 is disposed on the front side of the said connection stage 71b. The flexure wiring structure 75 has the same laminating structure as that in each of the aforementioned embodiments, and incldes terminal pads 76 for connection to the magnetic head slider and connection portions 77 for connection to the relay FPC 80.

The relay FPC 80 includes a distal end portion 80b extending to the connection stage 71b of the flexure, as illustrated in FIG. 17. The said distal end portion defines an opening 80a therein, through which the magnetic head slider is mounted on the slider-mounting region 74 of the flexure. The FPC signal line portion passes through the side edges of the distal end portion 80b to an edge 80c of the distal end portion 80b facing the connection stage 71b of the flexure. The structure for connection between the FPC wiring structure and the flexure wiring structure is the same as that in each of the aforementioned embodiments.

In addition to the effects in the first embodiment, the suspension according to this embodiment produces the following effects:

The connection stage 71b is provided on the flexure closer to its distal end, and the flexure wiring structure is connected to the FPC wiring structure on the said connection stage 71b, so that the flexure wiring structure needs not be formed on a narrow arm portion 72 in the gimbal portion 71a (see FIGS. 16 and 4). This provides improved flexibility to select materials, thickness, etc., for the insulating layer, the conductor layer and the protection layer constituting the flexure 70.

Offset-bending portions 73 are usually formed in the narrow arm portion 72 so as to protrude the slider-mounting region 74 towards the magnetic disk (see FIG. 16). The flexure wiring structure according to the first and second embodiments, which passes through the narrow arm portion (see FIG. 4), produces the likelihood of damaging the flexure wiring structure during offset-bending. On the contrary, the flexure wiring structure of this embodiment does not exist on the narrow arm portion 72, so that the flexure wiring structure is unlikely to be damaged during offset-bending the flexure.

In addition, the flexure wiring structure can be shortened in length as compared with that of the first and second embodiments, so that flexures can be manufactured with high yields.

In each of the embodiments, the description was made for the suspension with the substrate of the flexure joined to the load beam. However, it is not necessary to limit the present invention to these embodiments. Thus, it is possible to form the substrate of the flexure integral with the load beam.

This specification is by no means intended to restrict the present invention to the preferred embodiments set forth therein. Various modifications to the magnetic head suspension, as described herein, may be made by those skilled in the art without departing from the spirit and scope of the present invention as defined in the appended claims.

What is claimed is:

1. A magnetic head suspension including a distal end portion on which a magnetic head slider can be mounted and a proximal end portion adapted for being supported by an arm, which comprises:

a flexure including a plate shaped substrate forming at a distal end position thereof a gimbal portion with a magnetic-head-slider-mounting region, an insulating layer laminated on a magnetic-disk-facing side of said substrate, a conductor layer laminated on said insulating layer for constituting a flexure wiring structure, and an insulative protection layer covering said conductor layer;

a plate shaped load beam including a proximal end portion for being supported by said arm for constituting said suspension in cooperation with said flexure;

an FPC for connection between said conductor layer of said flexure and an external wiring structure;

said FPC including an insulative base layer located on a magnetic-disk-facing side thereof, a conductor layer laminated on a magnetic-disk-facing surface of said insulative base layer, said conductor layer constituting an FPC wiring structure, and an insulative protection layer covering said conductor layer of said FPC;

said flexure wiring structure including a terminal pad for connection to said magnetic head slider located closer to a distal end of said flexure, a connection portion for connection to said FPC wiring structure located closer to a proximal end of said flexure and a flexure signal line portion for connection between said terminal pad and said connection portion, said connection portion of said flexure wiring structure having a width substantially equal to that of said flexure signal line portion;

said FPC wiring structure including a connection portion for connection to said flexure wiring structure located closer to a distal end of said FPC wiring structure, a terminal pad for connection to said external wiring structure located closer to a proximal end of said FPC wiring structure and an FPC signal line portion for connection between said connection portion and said terminal pad, said FPC signal line portion having a characteristic impedance matching with that of said flexure signal line portion, said connection portion of said FPC wiring structure having a width substantially equal to that of said FPC signal line portion;

said connection portion of said flexure wiring structure having a length determined by multiplying a positional error in joining between said flexure and said FPC by two and adding the result to the width of said connection portion of said FPC wiring structure;

said connection portion of said FPC wiring structure having a length determined by multiplying said positional error by two and adding the result to the width of said connection portion of said flexure wiring structure; and said connection portion of said flexure wiring structure crossing said connection portion of said FPC wiring structure at right angle and connection thereto.

2. The magnetic head suspension as set forth in claim 1, wherein said substrate of said flexure is integrally formed with said load beam.

3. The magnetic head suspension as set forth in claim 1, wherein said connection portion of said flexure wiring structure is located within a distal end region of said load beam.

4. The magnetic head suspension as set forth in claim 1, wherein said connection portion of said flexure wiring structure is located within a proximal end region of said load beam.

5. The magnetic head suspension as set forth in claim 1, wherein said substrate of said flexure includes a connection stage distally extending from said gimbal portion to connect said connection portion of said flexure wiring structure to said connection portion of said FPC wiring structure within said connection stage.

6. The magnetic head suspension as set forth in claim 1, wherein said FPC includes on said insulative protection layer thereof a ground conductor layer which is fixed to a ground electric potential and electrically insulated from said conductor layer of said FPC.

7. The magnetic head suspension as set forth in claim 1, wherein said FPC includes said insulative protection layer thereof defining an opening closer to the distal end of said FPC to expose a surface of said conductor layer of said FPC via said opening, and a solder plated layer covering the surface of said conductor layer exposed via said opening to constitute said connection portion of said FPC wiring structure.

8. The magnetic head suspension as set forth in claim 1, wherein said flexure includes said insulative protection layer defining an opening closer to the proximal end thereof to expose a surface of said conductor layer of said flexure via said opening, and a solder plated layer covering the surface of said conductor layer exposed via said opening to constitute said connection portion of said flexure wiring structure.

9. The magnetic head suspension as set forth in claim 1, wherein said flexure and said FPC include dummy pads respectively formed on portions thereof overlapping to each other, said dummy pads being electrically insulated from said conductor layers of said flexure and said FPC for being connected together by soldering when joining said flexure and said FPC together.

* * * * *